(12) United States Patent
Lu

(10) Patent No.: US 9,141,733 B2
(45) Date of Patent: Sep. 22, 2015

(54) METHOD, SYSTEM, AND COMPUTER PROGRAM PRODUCT FOR MODELING RESISTANCE OF A MULTI-LAYERED CONDUCTIVE COMPONENT

(71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/084,652

(22) Filed: Nov. 20, 2013

(65) Prior Publication Data
US 2015/0143325 A1 May 21, 2015

(51) Int. Cl.
*G06F 17/50* (2006.01)
(52) U.S. Cl.
CPC ................. *G06F 17/5009* (2013.01)
(58) Field of Classification Search
CPC ...... G06F 17/30; G06F 17/50; G06F 2217/82
USPC ................... 716/136; 257/48, 421, E21.524, 257/E21.665, E27.006
See application file for complete search history.

(56) References Cited

U.S. PATENT DOCUMENTS

| | | | |
|---|---|---|---|
| 6,552,554 B1 | 4/2003 | Prinz et al. | |
| 7,138,581 B2 | 11/2006 | Morita | |
| 7,270,890 B2 | 9/2007 | Sabol et al. | |
| 7,408,367 B2 | 8/2008 | Weiss et al. | |
| 7,619,431 B2 | 11/2009 | De Wilde et al. | |
| 7,622,735 B2 | 11/2009 | Worledge et al. | |
| 8,595,663 B1 * | 11/2013 | Lu ................................ | 716/110 |
| 2002/0042698 A1 * | 4/2002 | Meuris et al. ..................... | 703/2 |
| 2010/0218145 A1 * | 8/2010 | Engin et al. ....................... | 716/3 |
| 2013/0297277 A1 | 11/2013 | Lu | |

OTHER PUBLICATIONS

IBM, et al., "Gate Dielectric Structure for Field Effect Transistors," IP.com IPCOM000082639D, Feb. 28, 2005, 3 pages.
Reiss, et al., "Resistivity and the Hall Effect in Polycrystalline Ni-Cu and Ta-Cu Multi-Layered Thin Films," J. Phys.: Condens. Matter 1, 1989, pp. 1275-1283.

* cited by examiner

*Primary Examiner* — Mohammed Alam
(74) *Attorney, Agent, or Firm* — Gibb & Riley, LLC; Anthony J. Canale

(57) ABSTRACT

Disclosed is a technique for modeling resistance of a conductive component of a device, where the component comprises multiple conductive materials. If necessary (e.g., for a complex conductive component), the component is divided into multiple conductive regions. For a given conductive region, current flow-through and current flow-in-and-terminate axes are determined and the conductive region is divided into layers. Relative electric currents flowing along the current flow-through axis in each layer and along the current flow-in-and-terminate axis in each layer are evaluated to determine a total resistance value for the conductive region. For a complex conductive component, these processes are repeated for all conductive regions and an overall resistance value is determined based on the corresponding total resistance values and, as calculated for each conductive region, a ratio of maximum electric current flowing in/out of the conductive region to the total electric current flowing out of the complex conductive component.

20 Claims, 10 Drawing Sheets

METHOD, SYSTEM, AND COMPUTER PROGRAM PRODUCT FOR MODELING RESISTANCE OF A MULTI-LAYERED CONDUCTIVE COMPONENT

BACKGROUND

This disclosure relates to modeling parasitic resistances in semiconductor devices and, more particularly, to a method, system and computer program product for modeling the resistance of a simple or a complex multi-layered conductive component of a semiconductor device.

The parasitic resistance of a conductive component of a semiconductor device (e.g., a gate structure of a field effect transistor (FET), a local interconnect used in a source/drain region of a FET, etc.) will impact the performance of an integrated circuit and, particularly, the performance of very large scale integration (VLSI) circuits, such as ring oscillators, logic gates (e.g., NAND gates, NOR gates, etc.), etc., which incorporates the semiconductor device. For example, the relatively high resistance associated with the flow of current through a local interconnect used in a source/drain region of FET and/or the relatively high resistance associated with the flow of current through the gate structure of that FET can cause the FET to exhibit a relatively slow switching speed. Thus, during semiconductor device design (e.g., during FET design), accurate modeling of the resistances of conductive components of the semiconductor device (e.g., accurate modeling of the resistances of any local interconnect used in the source/drain region of the FET and of the gate structure of the FET) is very important.

Various techniques are well known in the art for modeling the resistances of conductive components in a semiconductor device. Unfortunately, accuracy issues can be associated with such prior art resistance modeling techniques when the conductive component comprises multiple layers of different types of conductive materials and, particularly, when the conductive component has a complex three-dimensional geometry. Specifically, in the case of a gate structure with multiple layers of different types of conductive materials (e.g., as seen in high-K metal-gate FETs, including planar FETs and multi-gate non-planar FETs (MUGFETS), such as double-gate non-planar FETs, also referred to herein as fin-type FETs (FINFETs), and tri-gate non-planar FETs), the prior art gate resistance modeling techniques do not provide accurate results because they do not account for the different types of conductive materials within the gate structure and the complex three-dimensional geometry of the gate structure. Similar accuracy issues can be associated with modeling the resistance of a multi-layered local interconnect used in the source/drain region of a FET (e.g., in the source/drain region of a high-K metal-gate FET). Therefore, there is a need in the art for a technique that can be used to more accurately model the resistance of a multi-layered conductive component of semiconductor device (e.g., a multi-layered gate structure of a planar FET, a multi-layered gate structure of a non-planar FET, a multi-layered local interconnect used in the source/drain region of a FET, etc.).

SUMMARY

In view of the foregoing, disclosed herein is a method, system and computer program product for accurately modeling the resistance of a conductive component of a semiconductor device, where the conductive component comprises multiple conductive materials. Specifically, a design for a semiconductor device can be stored in memory and this semiconductor device can comprise conductive component, such as a simple conductive component or a complex conductive component. The design can be accessed and, if necessary (e.g., in the case of a complex conductive component as opposed to a simple conductive component), the conductive component can be divided into multiple conductive regions for resistance evaluation purposes. Next, for a given conductive component (e.g., for a simple conductive component or, if applicable, for a conductive region of a complex conductive component), the current flow-through axis and the current flow-in-and-terminate axis can be determined. Additionally, the conductive region can be divided into layers for resistance evaluation purposes. Then, the relative electric currents flowing along the current flow-through axis and along the current flow-in-and-terminate axis in each of the layers in the conductive region can be evaluated in order to determine a total resistance value for the conductive region. In the case of a complex conductive component, these processes can be repeated for all of the conductive regions and an overall resistance value can be determined based on the corresponding total resistance values and, as calculated for each conductive region, a ratio of maximum electric current flowing in/out of the conductive region to the total electric current flowing out of the complex conductive component.

More particularly, disclosed herein is a modeling method. In this method, a design for a semiconductor device can be accessed from a memory by a processor of a computer system in order to model the resistance of a conductive component of the semiconductor device. Specifically, the semiconductor device can comprise a conductive component and, particularly, either a simple conductive component or a complex conductive component, which comprises multiple conductive materials. A simple conductive component can comprise, for example, a gate structure of a planar field effect transistor (FET), a simple local interconnect structure used in a source/drain region of a FET, etc. A complex conductive component can comprise, for example, a gate structure of a non-planar FET, a complex local interconnect structure used in the source/drain region of a FET, etc.

If the conductive component comprises a simple conductive component, it can be treated as a single conductive region for resistance evaluation purposes. Alternatively, if the conductive component comprises a complex conductive component, the method can further comprise dividing, by the processor, this complex conductive component into multiple conductive regions for resistance evaluation purposes. In any case, each conductive region can comprise the multiple conductive materials.

Next, the method can comprise determining, by the processor, a current flow-through axis as well as a current flow-in-and-terminate axis associated with a conductive region (i.e., the single conductive region of a simple conductive component or given one of the multiple conductive regions of a complex conductive component). Additionally, the conductive region can be divided into layers for resistance evaluation purposes. Then, the relative electric currents that flow along the current flow-through axis and along the current flow-in-and-terminate axis in each of the layers in that conductive region can be evaluated in order to determine a total resistance value for the conductive region.

It should be noted that, in the case of a complex conductive component, the following processes can be repeated for each of the multiple conductive regions: determining the current flow-through axis and the current flow-in-and-terminate axis of a given conductive region, dividing the given conductive region into layers for resistance evaluation purposes, and evaluating the relative electric currents along the two axes in each layer to obtain a total resistance value for the given conductive region. Then, the corresponding total resistance values for all of the multiple conductive regions and, as calculated for each conductive region, a ratio of maximum electric current flowing in/out of the conductive region to the total electric current flowing out of the complex conductive component can be used to determine an overall resistance value for that complex conductive component.

Also disclosed herein is a modeling system. The system can comprise at least a processor and a memory accessible by the processor. The memory can store a design for a semiconductor device. This semiconductor device can comprise a conductive component and, particularly, either a simple conductive component or a complex conductive component, which comprises multiple conductive materials. A simple conductive component can comprise, for example, a gate structure of planar field effect transistor (FET), a simple local interconnect structure used in the source/drain region of a FET, etc. A complex conductive component can comprise, for example, a gate structure of a non-planar FET, a complex local interconnect structure used in the source/drain region of a FET, etc.

The processor can access the design in the memory in order to model the resistance of the conductive component. Specifically, if the conductive component comprises a simple conductive component, the processor can treat it as a single conductive region for resistance evaluation purposes, as described below. Alternatively, if the conductive component comprises a complex conductive component, the processor can divide this complex conductive component into multiple conductive regions for resistance evaluation purposes. In any case, each conductive region can comprise the multiple conductive materials.

Next, the processor can determine a current flow-through axis as well as a current flow-in-and-terminate axis associated with a conductive region (i.e., the single conductive region of a simple conductive component or a given one of the multiple conductive regions of a complex conductive component). Additionally, the processor can divide that conductive region into layers for resistance evaluation purposes. Then, the processor can evaluate the relative electric currents that flow along the current flow-through axis and along the current flow-in-and-terminate axis in each of the layers in that conductive region in order to determine a total resistance value for the conductive region.

It should be noted that, in the case of a complex conductive component, the processor can repeat, for each of the multiple conductive regions, the processes of determining the current flow-through axis and the current flow-in-and-terminate axis of a given conductive region, dividing the given conductive region into layers for resistance evaluation purposes, and evaluating the relative electric currents along the two axes in each layer to obtain a total resistance value for the given conductive region. Then, the processor can determine an overall resistance value for the complex conductive component based on the corresponding total resistance values for all of the multiple conductive regions and, as calculated for each conductive region, a ratio of maximum electric current flowing in/out of that conductive region to the total electric current flowing out of the complex conductive component.

Also disclosed herein is a computer program product. The computer program product can comprise a computer readable storage medium that stores computer program code. The computer program code can be executable by a computer to perform the above-described modeling method.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
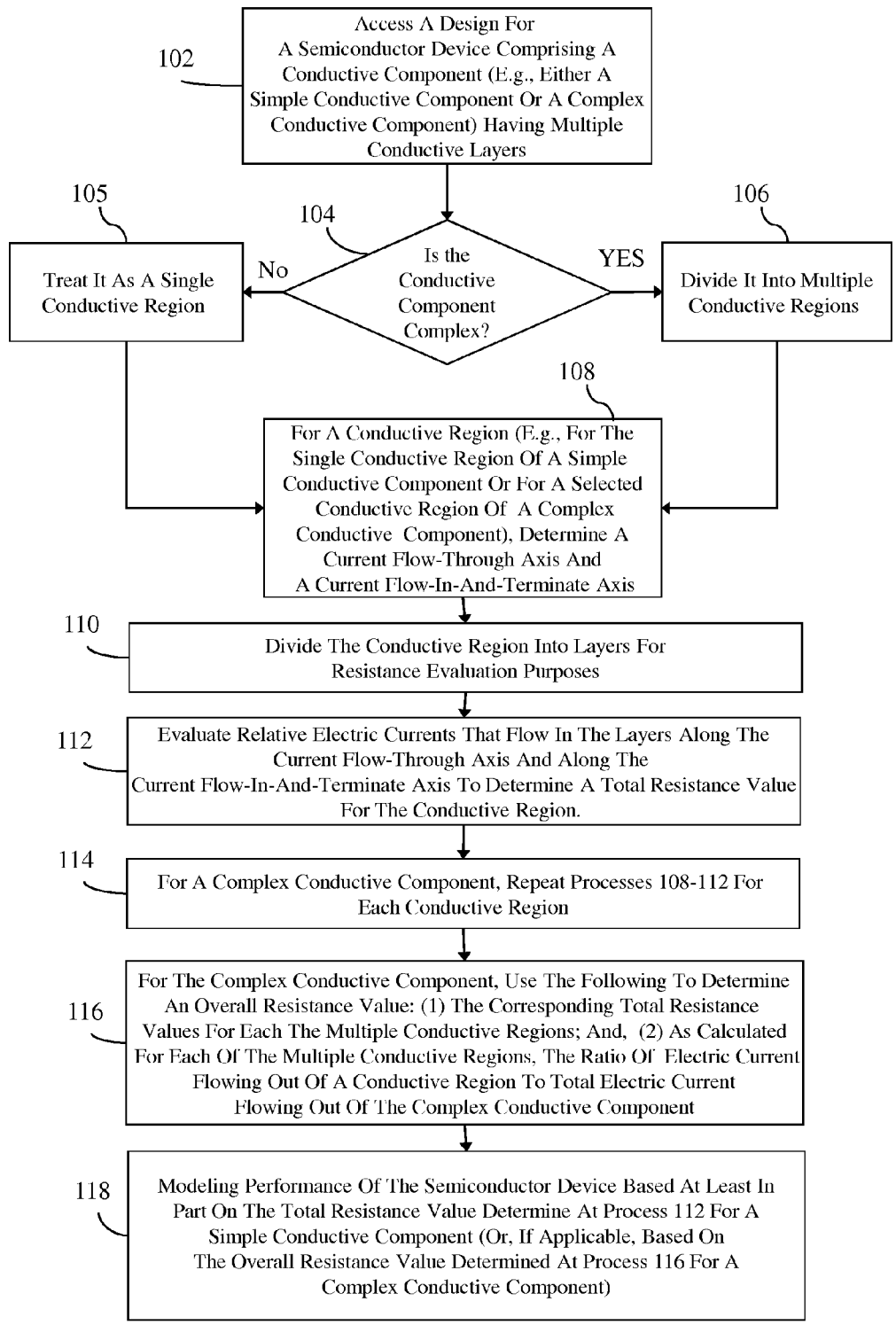
FIG. 1 is a flow diagram illustrating a resistance modeling method.

As mentioned above, the parasitic resistance of a conductive component of a semiconductor device (e.g., a gate structure of a field effect transistor (FET), a local interconnect used in the source/drain region of a FET, etc.) will impact the performance of an integrated circuit and, particularly, the performance of very large scale integration (VLSI) circuits, such as ring oscillators, logic gates (e.g., NAND gates, NOR gates, etc.), etc., which incorporates the semiconductor device. For example, the relatively high resistance associated with the current flow through a local interconnected used in a source/drain region of a FET and/or the relatively high resistance associated with flow of current through the gate structure of that FET can cause the FET to exhibit a relatively slow switching speed. Thus, during semiconductor device design (e.g., during FET design), accurate modeling of the resistances of conductive components of the semiconductor device (e.g., accurate modeling of the resistances of any local interconnect used in the source/drain region of the FET and of the gate structure of the FET) is very important.

Various techniques are well known in the art for modeling the resistances of conductive components in a semiconductor device. Unfortunately, accuracy issues can be associated with such prior art resistance modeling techniques when the conductive component comprises multiple layers of different types of conductive materials and, particularly, when the conductive component has a complex three-dimensional geometry. Specifically, in the case of gate structures with multiple layers of different types of conductive materials (e.g., as seen in high-K metal-gate FETs, including planar FETs and multi-gate non-planar FETs (MUGFETS), such as double-gate non-planar FETs, also referred to herein as fin-type FETs (FINFETs) and tri-gate non-planar FETs), the prior art gate resistance modeling techniques do not provide accurate results because they do not account for the different types of conductive materials within the gate structure and the complex three-dimensional geometry of the gate structure. Similar accuracy issues can be associated with modeling the resistance of a multi-layered local interconnect used in the source/drain region of a FET (e.g., in the source/drain region of a high-K metal-gate FET). Therefore, there is a need in the art for a technique that can be used to more accurately model the resistance of a multi-layered conductive component of semiconductor device (e.g., a multi-layered gate structure of a planar FET, a multi-layered gate structure of a non-planar FET, a multi-layered local interconnect used in the source/drain region of a FET, etc.).

In view of the foregoing, disclosed herein is a method, system and computer program product for accurately modeling the resistance of a conductive component of a semiconductor device, where the conductive component comprises multiple conductive materials. Specifically, a design for a semiconductor device can be stored in memory and this semiconductor device can comprise conductive component, such as a simple conductive component or a complex conductive component. The design can be accessed and, if necessary (e.g., in the case of a complex conductive component as opposed to a simple conductive component), the conductive component can be divided into multiple conductive regions for resistance evaluation purposes. Next, for a given conductive component (e.g., for a simple conductive component or, if applicable, for a conductive region of a complex conductive component), the current flow-through axis and the current flow-in-and-terminate axis can be determined. Additionally, the conductive region can be divided into layers for resistance evaluation purposes. Then, the relative electric currents flowing along the current flow-through axis and along the current flow-in-and-terminate axis in each of the layers in the conductive region can be evaluated in order to determine a total resistance value for the conductive region. In the case of a complex conductive component, these processes can be repeated for all of the conductive regions and an overall resistance value can be determined based on the corresponding total resistance values and, as calculated for each conductive region, a ratio of maximum electric current flowing in/out of that conductive region to the total electric current flowing out of the complex conductive component.

More particularly, referring to the flow diagram of FIG. 1, disclosed herein is a modeling method. This modeling method can be implemented, for example, using a modeling system 1100, such as that described in detail below, depicted in FIG. 11 and implemented in a computer hardware environment such as that described in detail below and depicted in FIG. 12. In this method, a design for a semiconductor device, such as the semiconductor device 200 shown in FIGS. 2A-2B or the semiconductor device 300 shown in FIGS. 3A-3B, can be accessed from a memory by a processor of a computer system in order to model the resistance of a conductive component of the semiconductor device. Specifically, the semiconductor device 200, 300 can comprise a conductive component 230, 330 comprising multiple conductive materials 233-237, 333-337 and, particularly, either a simple conductive component 230 comprising multiple conductive materials 233-237 as in the semiconductor device 200 or a complex conductive component 330 comprising multiple conductive materials 333-337 as in the semiconductor device 300.

For purposes of this disclosure a simple conductive component is a conductive component that receives electric current through a single essentially planar surface (e.g., through a single horizontal or vertical surface), whereas a complex conductive component is a conductive component that receives electric current through multiple different planar surfaces (e.g., through multiple horizontal and/or vertical surfaces). Furthermore, for purposes of illustration, the conductive components 230, 330 of the semiconductor devices 200, 300 are shown and described in detail below as gate structures. However, it should be understood that the method described herein could alternatively be applied in order to model the resistance of other types of simple or complex conductive structures comprising multiple conductive materials (e.g., simple or complex local interconnect structures used in source/drain regions of FETs).

Figure 2A:
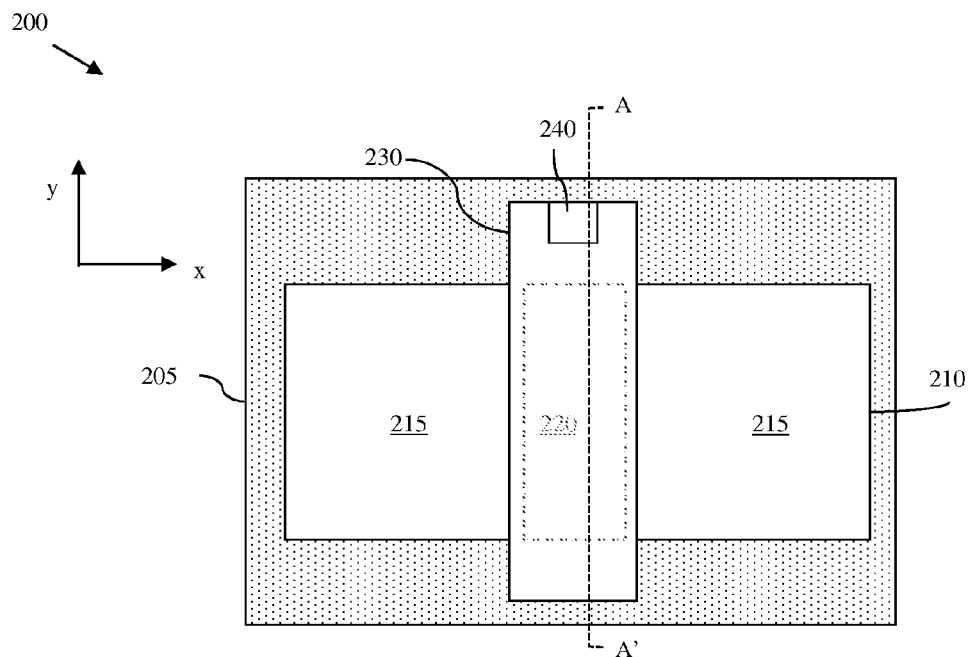
FIG. 2A is a top view diagram illustrating a planar field effect transistor (FET)
Figure 2B:
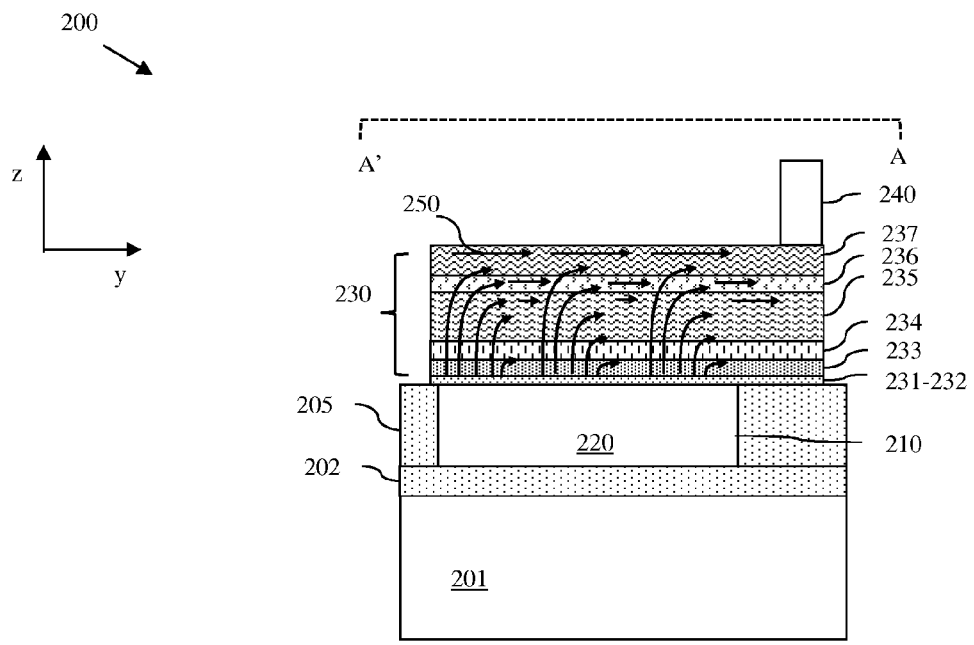
FIG. 2B is a cross-section diagram illustrating the planar FET of FIG. 2A.

More specifically, FIGS. 2A and 2B are top view and cross-section illustrations, respectively, of a planar field effect transistor (FET) 200. This planar FET 200 can comprise a semiconductor body 210 (e.g., a silicon body or any other suitable semiconductor body) defined by an isolation region 205. The semiconductor body 210 can be formed on a semiconductor-on-insulator (SOI) wafer. That is, it can be positioned above a buried insulator layer 202 (e.g., a silicon dioxide ($SiO_2$) layer, a sapphire layer or any other suitable insulator layer) on a semiconductor substrate 201 (e.g., a silicon substrate) (as shown). Alternatively, this semiconductor body 210 can be a defined portion of a bulk semiconductor substrate (e.g., a bulk silicon substrate). This semiconductor body 210 can comprise a channel region 220 positioned laterally between source-drain regions 215. A gate structure 230 can be positioned on the top surface of the semiconductor body 210 traversing the channel region 220.

The gate structure 230 can comprise one or more gate dielectric materials 231-232 and multiple gate conductor materials 233-237 above the gate dielectric materials. For example, in the case of an N-type planar FET, the gate dielectric materials can comprise an interfacial gate oxide 231 immediately adjacent to the channel region 220 and a high-K gate dielectric 232 (e.g., a hafnium-based material, such as $HfO_2$, HfSiO, HfSiON, or HfAlO, or some other suitable high-K dielectric material, such as $Al_2O_3$, $TaO_5$, $ZrO_5$, etc.) on the interfacial gate oxide 231. Additionally, the gate conductor materials can comprise a first gate conductor 233 (e.g., a titanium nitride barrier gate conductor) on the gate dielectrics 231-232, a second gate conductor 234 (e.g., a titanium carbide gate conductor having an N-type work function) on the first gate conductor 233, a third gate conductor 235 (e.g., another titanium nitride gate conductor) on the second gate conductor 234, a fourth gate conductor 236 (e.g., a cool fill tungsten gate conductor) on the third gate conductor 235 and a fifth gate conductor 237 (e.g., a hot fill tungsten gate conductor) on the fourth gate conductor 236. The exemplary materials referenced above for the gate dielectrics 231-232 and gate conductors 233-237 of the gate structure 230 are provided for illustration purposes only and this description is not intended to be limiting. It should be understood that the gate structure 230 can comprise any other suitable gate dielectric material(s) and multiple gate conductor materials above the gate dielectric material(s). For example, alternatively, the gate structure 230 could comprise a single gate dielectric material (e.g., a gate oxide only) and two gate conductor materials above the gate dielectric material (e.g., a doped polysilicon gate conductor on the gate oxide layer and a silicide gate conductor on the doped polysilicon gate conductor).

This gate structure 230 is, for purposes of this disclosure, considered a simple conductive component because electric current 250 flows into the gate structure 230 at only one surface (i.e., at the bottom surface of the gate structure 230 from the top surface of the channel region 220 of the semiconductor body 210 only). This electric current 250 then turns toward the contact 240.

Figure 3A:
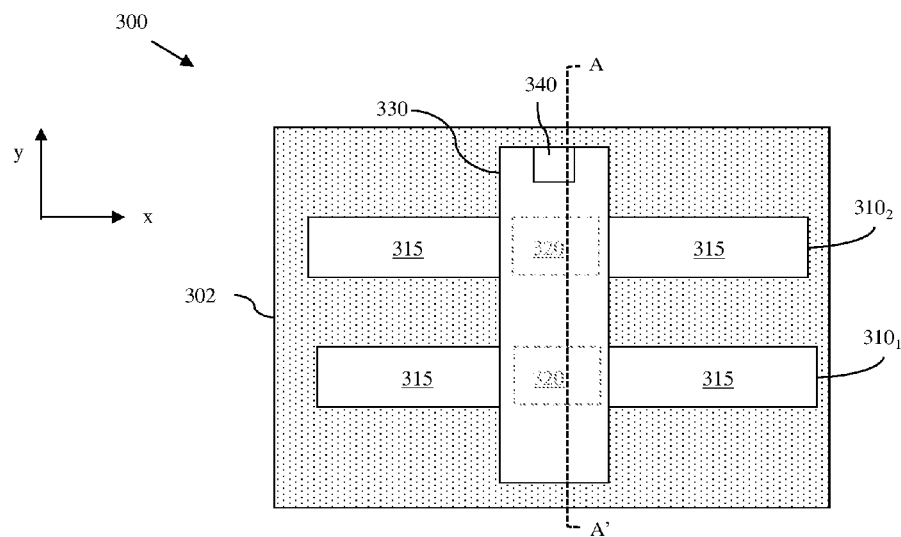
FIG. 3A is a top view diagram illustrating a non-planar field effect transistor (FET)
Figure 3B:
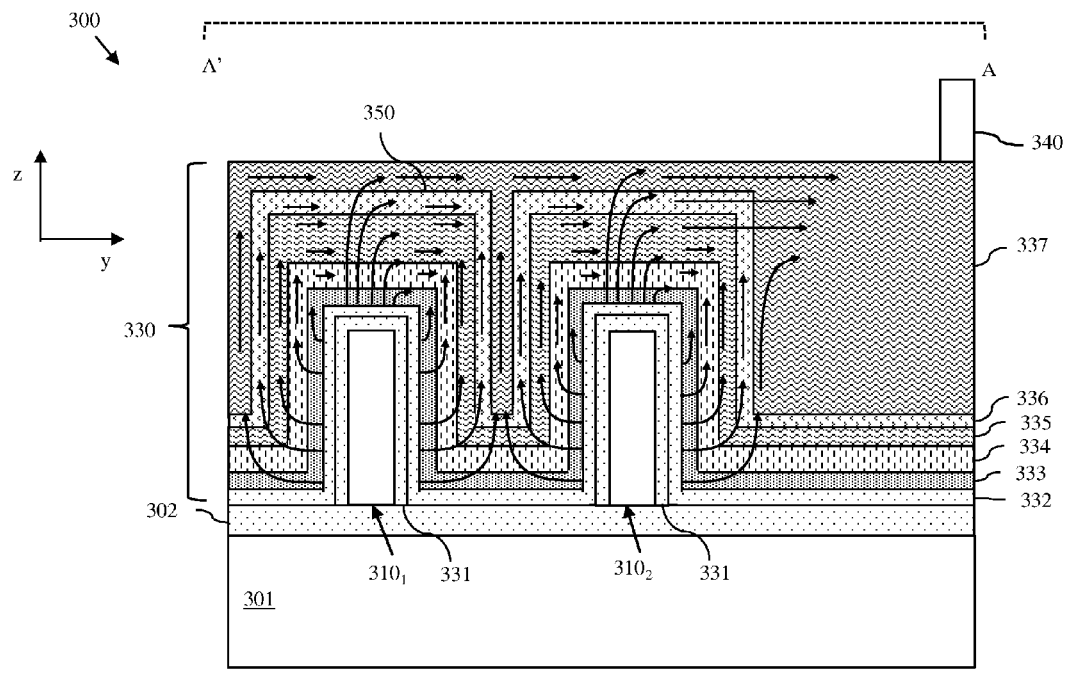
FIG. 3B is a cross-section diagram illustrating the non-planar FET of FIG. 3A.

FIGS. 3A and 3B are top view and cross-section illustrations of a non-planar field effect transistor (FET) 300 and, particularly, a multi-fin multi-gate field effect transistor (i.e., a multi-fin MUGFET). This non-planar FET 300 can comprise a plurality of essentially parallel semiconductor fins $310_{1-2}$. For illustration purposes, two semiconductor fins are shown. However, it should be understood that this non-planar FET 300 can comprise any number of one or more semiconductor fins. The semiconductor fins $310_{1-2}$ can comprise, for example, silicon fins or fins etched from any other suitable semiconductor material. For purposes of this disclosure, a semiconductor fin refers to a relatively thin, vertically oriented, essentially rectangular, three-dimensional semiconductor body, which is patterned and etched, for example, from a semiconductor layer (e.g., a silicon layer or any other suitable semiconductor layer) of a semiconductor-on-insulator (SOI) wafer. Thus, the semiconductor fins $310_{1-2}$ can be positioned on the top surface of an insulator layer 302 (e.g., a silicon dioxide ($SiO_2$) layer, a sapphire layer or any other suitable insulator layer) above a semiconductor substrate 301 (e.g., a silicon substrate or any other suitable semiconductor substrate). Those skilled in the art will recognize that when the multi-fin MUGFET 300 comprises a dual-gate FET (as opposed to a tri-gate FET), each of the semiconductor fins $310_{1-2}$ can be capped with a dielectric cap (not shown) (e.g., a silicon nitride cap, a silicon oxide cap, a silicon oxynitride cap or any other suitable dielectric cap) such that no current would flow into the gate structure 330 from the top surface of the semiconductor fins. Each of the semiconductor fins $310_{1-2}$ can comprise a channel region 320 positioned laterally between source/drain regions 315. A gate structure 330 can be positioned on the top surface and opposing sidewalls of each semiconductor fin $310_{1-2}$ adjacent to the channel region 320.

The gate structure 330 can comprise one or more gate dielectric materials 331-332 and multiple gate conductor materials 333-337 above the gate dielectric materials. For example, in the case of an N-type non-planar FET, the gate dielectric materials can comprise an interfacial gate oxide 331 on the top surface and opposing sidewalls of each fin $310_{1-2}$ immediately adjacent to the channel region 320 without extending laterally over the top surface of the insulator layer 302 between the fins $310_{1-2}$ and a high-K gate dielectric 332 (e.g., a hafnium-based material, such as $HfO_2$, $HfSiO$, $HfSiON$, or $HfAlO$, or some other suitable high-K dielectric material, such as $Al_2O_3$, $TaO_5$, $ZrO_5$, etc.) can cover the interfacial gate oxide 331 and further extend laterally over the insulator layer 302 between the fins $310_{1-2}$. Additionally, the gate conductor materials can comprise a first gate conductor 333 (e.g., a titanium nitride barrier gate conductor) on the gate dielectrics 331-332, a second gate conductor 334 (e.g., a titanium carbide gate conductor having an N-type work function) on the first gate conductor 333, a third gate conductor 335 (e.g., another titanium nitride gate conductor) on the second gate conductor 334, a fourth gate conductor 336 (e.g., a cool fill tungsten gate conductor) on the third gate conductor 335 and a fifth gate conductor 237 (e.g., a hot fill tungsten gate conductor) on the fourth gate conductor 336.

The exemplary materials referenced above for the gate dielectric material(s) 331-332 and gate conductor materials 333-337 of the gate structure 330 are provided for illustration purposes only and this description is not intended to be limiting. It should be understood that the gate structure 330 can comprise any other suitable gate dielectric material(s) and multiple gate conductor materials above the gate dielectric materials(s). For example, alternatively, the gate structure 330 could comprise a single gate dielectric material (e.g., a gate oxide only) and two gate conductor materials above the gate dielectric layer(s) (e.g., a doped polysilicon gate conductor on the gate oxide and a silicide gate conductor on the doped polysilicon gate conductor).

This gate structure 330 is, for purposes of this disclosure, a complex conductive component because electric current 350 flows into the gate structure 330 at multiple surfaces (i.e., from the top surface and opposing sidewalls of the channel region 320 of each semiconductor fin $310_{1-2}$). This electric current 350 then turns toward the contact 340.

Next, the method can comprise analyzing (e.g., by the processor of the computer system) the design of the semiconductor device 200, 300 in order to model the resistance of the conductive component 230, 330 and to further modeling the performance of the semiconductor device 200, 300 based on this resistance. Specifically, a determination can first be made as to whether or not the conductive component 230, 330 is a simple conductive component or a complex conductive component (104). If the conductive component comprises a simple conductive component as with the gate structure 230 of the planar FET 200 of FIGS. 2A-2B, it can be treated as a single conductive region for subsequent resistance evaluation purposes (105). Alternatively, if the conductive component comprises a complex conductive component as with the gate structure 330 of the non-planar FET 300 of FIGS. 3A-3B, the method can further comprise dividing (e.g., by the processor of the computer system) this complex conductive component into multiple conductive regions for resistance evaluation purposes (106). Specifically, the gate structure 330 is divided such that within each conductive region, when moving along a "flow-through" axis (to be described in detail below), the cross-section/composition of the conductive region is essentially unchanged.

Figure 4:
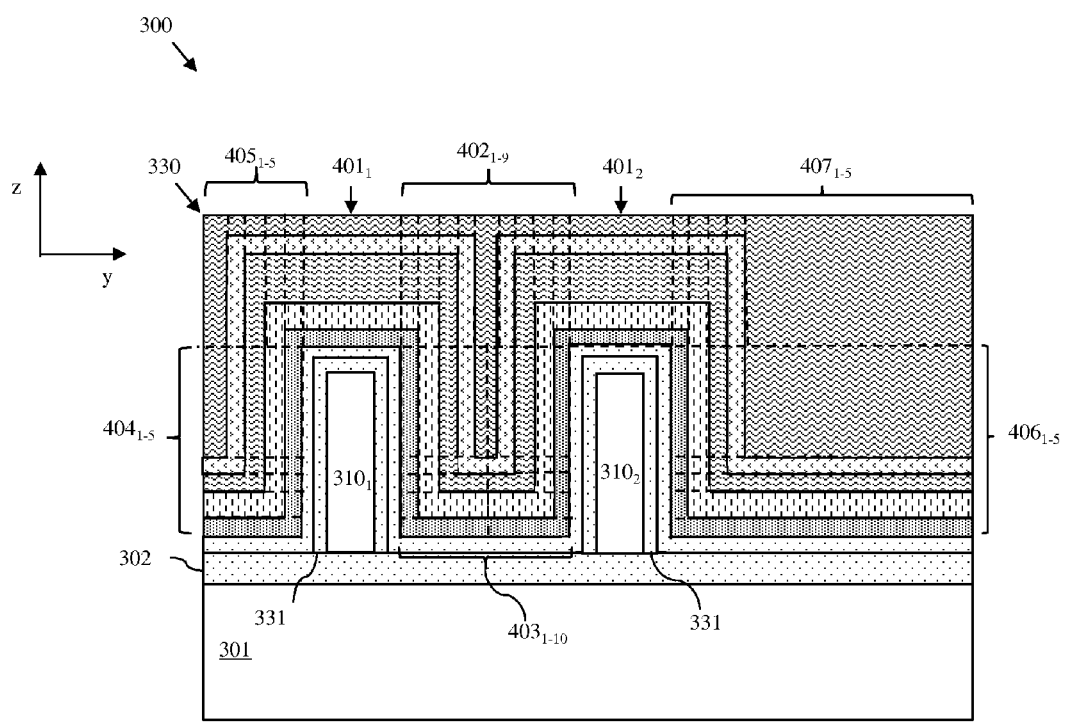
FIG. 4 is a cross-section diagram illustrating the gate structure of the non-planar FET of FIG. 3B divided into multiple conductive regions.

Thus, as illustrated in FIG. 4, the gate structure 330 can be divided such that it comprises the following conductive regions: two first conductive regions $401_{1-2}$, which are aligned directly over the first and second semiconductor fin $310_{1-2}$, respectively (i.e., essentially over-fin conductive regions); nine second conductive regions $402_{1-9}$, which are positioned laterally between the first conductive regions $401_1$ and $401_2$ above the level of the top surface of the semiconductor fins $310_{1-2}$ and aligned above the space between those semiconductor fins $310_{1-2}$ (i.e., between-fin and above-fin-top conductive regions); ten third conductive regions $403_{1-10}$, which are between the first and second semiconductor fin $310_{1-2}$ (i.e., between-fin and below-fin-top conductive regions); five fourth conductive regions $404_{1-5}$, which are adjacent to the outer side of the first semiconductor fin $310_1$; five fifth conductive regions $405_{1-5}$, which are above the fourth conductive regions and positioned laterally adjacent to the first conductive region $401_1$ opposite the second region $402_1$; five sixth conductive regions $406_{1-5}$, which are adjacent to the outer side of the second semiconductor fin $310_2$; and five seventh conductive regions $407_{1-5}$, which are above the sixth conductive regions and positioned laterally adjacent to the first conductive region $401_2$ opposite the second conductive region $402_{1-9}$.

It should be noted that these conductive regions do not include the gate dielectric materials because gate dielectric materials conduct only alternating current and not direct current.

Figure 5:
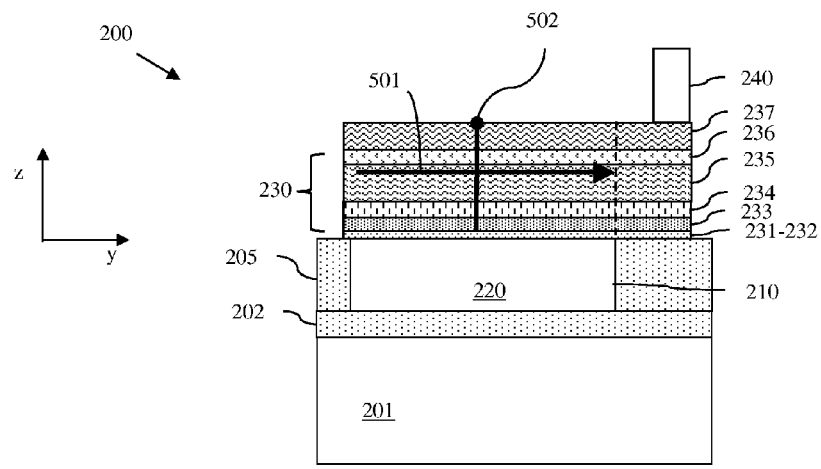
FIG. 5 is a cross-section diagram illustrating the current flow-through axis and current flow-in-and-terminate axis of the single conductive region in the gate structure of the planar FET of FIG. 2B.
Figure 6:
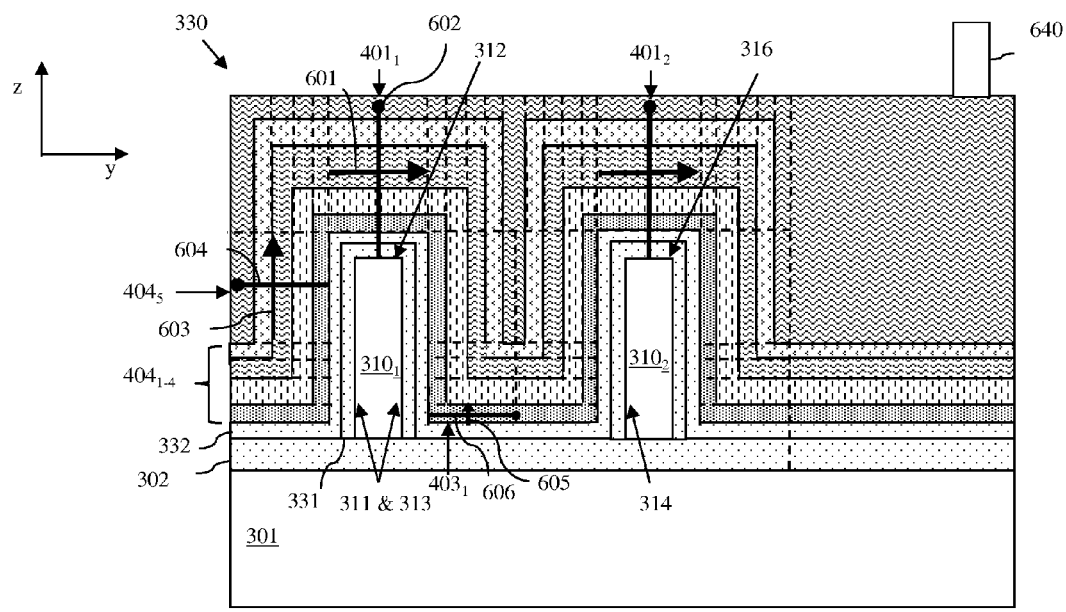
FIG. 6 is a cross-section diagram illustrating the current flow-through axis and current flow-in-and-terminate axis of several of the conductive regions of the non-planar FET of FIG. 3B.

Next, the method can comprise determining, by the processor, a current flow-through axis as well as a current flow-in-and-terminate axis associated with a given conductive region (108). For purposes of this disclosure, a current flow-through axis refers to the axis along which electric current flowing through the conductive region exits the conductive region, whereas the current flow-in-and-terminate axis refers to the axis along which electric current enters the conductive region but does not exit (i.e., the electric current changes direction prior to exiting the conductive region). The current flow-through axis will be substantially perpendicular to the current flow-in-and-terminate axis. Thus, for example, for the single conductive region of the gate structure 230 of the planar FET 200, a current flow-through axis 501 as well as a current flow-in-and-terminate axis 502 can be determined, as shown in FIG. 5. In this case, the current flow-in-and-terminate axis 502 corresponds to the z-axis because electric current enters the single conductive region vertically and the current flow-through axis 501 corresponds to the y-axis because the electric current turns to the right (i.e., towards the contact 240). Similarly, for a selected over-fin conductive region $401_1$ of the gate structure 330 of the non-planar FET 300, a current flow-through axis 601 as well as a current flow-in-and-terminate axis 602 can be determined, as shown in FIG. 6. In this case, the current flow-in-and-terminate axis 602 corresponds to the z-axis because electric current enters the over-fin conductive region $401_1$ vertically and the current flow-through axis 601 corresponds to the y-axis because the electric current turns to the right (i.e., towards the contact 640).

It should be noted that the orientation of these different axes will vary depending upon the direction through which electric current enters and exits the particular conductive region. For example, for a different selected conductive region (e.g., conductive region $404_5$ of the gate structure 330 of the non-planar FET 300), a current flow-through axis 603 as well as a current flow-in-and-terminate axis 604 can be determined, also as shown in FIG. 6. In this case, the current flow-in-and-terminate axis 604 corresponds to the y-axis because electric current enters the conductive region $404_5$ horizontally and the current flow-through axis 603 corresponds to the z-axis because the electric current turns to the right (i.e., towards the contact 640). For another different selected conductive region (e.g., conductive region $403_1$ of the gate structure 330 of the non-planar FET 300), a current flow-through axis 605 as well as a current flow-in-and-terminate axis 606 can be determined, also as shown in FIG. 6. In this case, the current flow-in-and-terminate axis 606 corresponds to the y-axis because electric current enters the conductive region $403_1$ horizontally and the current flow-through axis 605 corresponds to the z-axis because the electric current turns to the left (i.e., towards the contact 640).

Additionally, the method can comprise dividing the given conductive region into multiple layers (e.g., M total layers) along the flow-in-and terminate axis for resistance evaluation purposes (110). This division is performed such that along the flow-in-and-terminate axis, the cross-section/composition of each layer remains essentially unchanged. The mth layer (m=1, 2, . . . , M) may contain one or more sections (e.g., $N_m$ total sections) of any of one or more of the different gate conductor materials 333-337. Thus, the number $N_m$ of sections in each layer may vary with m. As a result of the techniques used to divide a complex conductive component into multiple conductive regions at process 106 (if applicable) and the given conductive region into M layers at process 110, all sections will have the same length. Furthermore, within any given layer, each section will have the same height; however, the widths of the sections and, thereby the areas of the section may vary.

Figure 7A:
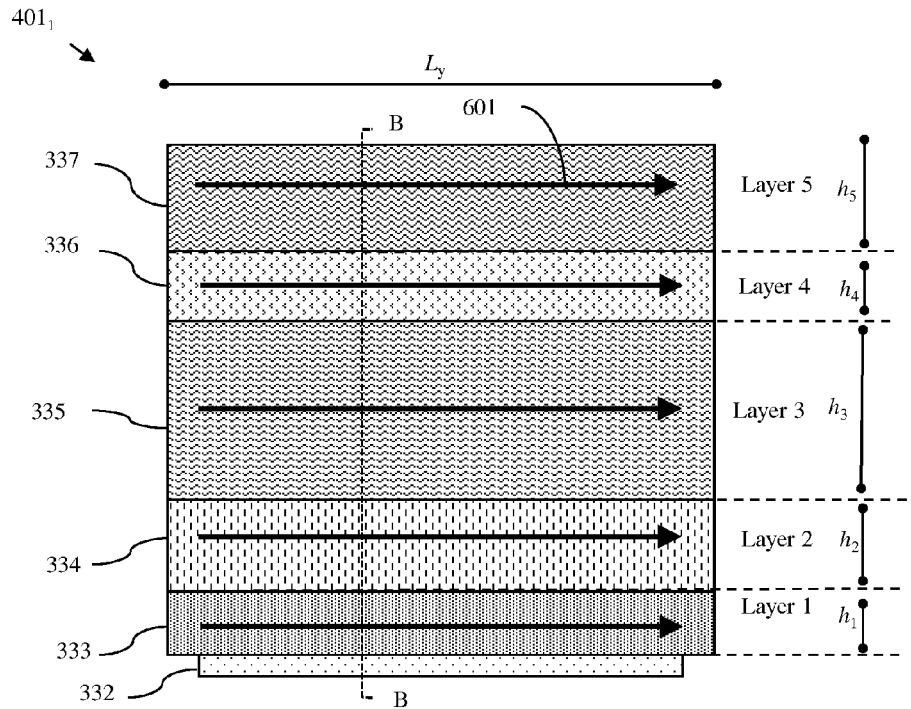
FIG. 7A is a cross-section view of a conductive region $401_1$ of the gate structure of the non-planar FET of FIG. 3B divided into 5 layers.
Figure 7B:
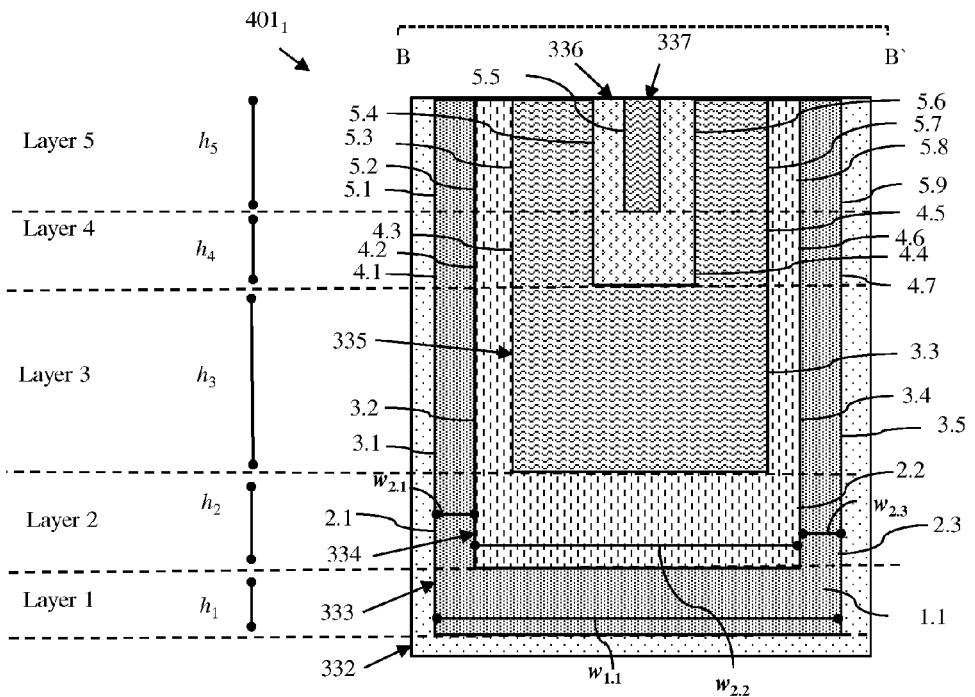
FIG. 7B is a different cross-section view of the conductive region $401_1$ of the gate structure of the non-planar FET of FIG. 3B divided into 5 layers.

For example, FIGS. 7A and 7B are illustrations of different cross-section views of the conductive region $401_1$ of the gate structure 330 of the non-planar FET 300 divided into 5 layers (see Layers 1-5). As shown in FIG. 7B in the conductive region $401_1$, Layer 1 contains a single section 1.1 of the first gate conductor 333; Layer 2 contains two sections 2.1 and 2.3 of the first gate conductor 333 and a section 2.2 of the second gate conductor 334; Layer 3 contains two sections 3.1 and 3.5 of the first gate conductor 333, two sections 3.2 and 3.4 of the second gate conductor 334 and a section 3.3 of the third gate conductor 335; Layer 4 contains two sections 4.1 and 4.7 of the first gate conductor 333, two sections 4.2 and 4.6 of the second gate conductor 334, two sections 4.3 and 4.5 of the third gate conductor 335 and a single section 4.4 of the fourth gate conductor 336; and, Layer 5 contains two sections 5.1 and 5.9 of the first gate conductor 333, two sections 5.2 and 5.8 of the second gate conductor 334, two sections 5.3 and 5.7 of the third gate conductor 335, two sections 5.4 and 5.6 of the fourth gate conductor 336 and a single section 5.5 of the fifth gate conductor 337. As a result of the techniques used to divide a complex conductive component into multiple conductive regions at process 106 (if applicable) and also to divide the conductive region $401_1$ into the Layers 1-5 at process 110, all sections will have the same length ($L_y$) along the current flow-through axis. Furthermore, within any given layer, each section will have the same height ($h_{1-5}$, respectively) along the current flow-in-and-terminate axis; however, the widths and, thereby the areas of the sections may vary. For example, within Layer 1, section 1.1 has a width of $w_{1.1}$, a height of $h_1$ and a length of $L_y$; within Layer 2, section 2.1 has a width of $w_{2.1}$, a height of $h_2$ and a length of $L_y$, section 2.2 has a width of $w_{2.2}$, a height of $h_2$ and a length of $L_y$, and section 2.3 has a width of $w_{2.3}$, a height of $h_2$ and a length of $L_y$; and so on.

Figure 8:
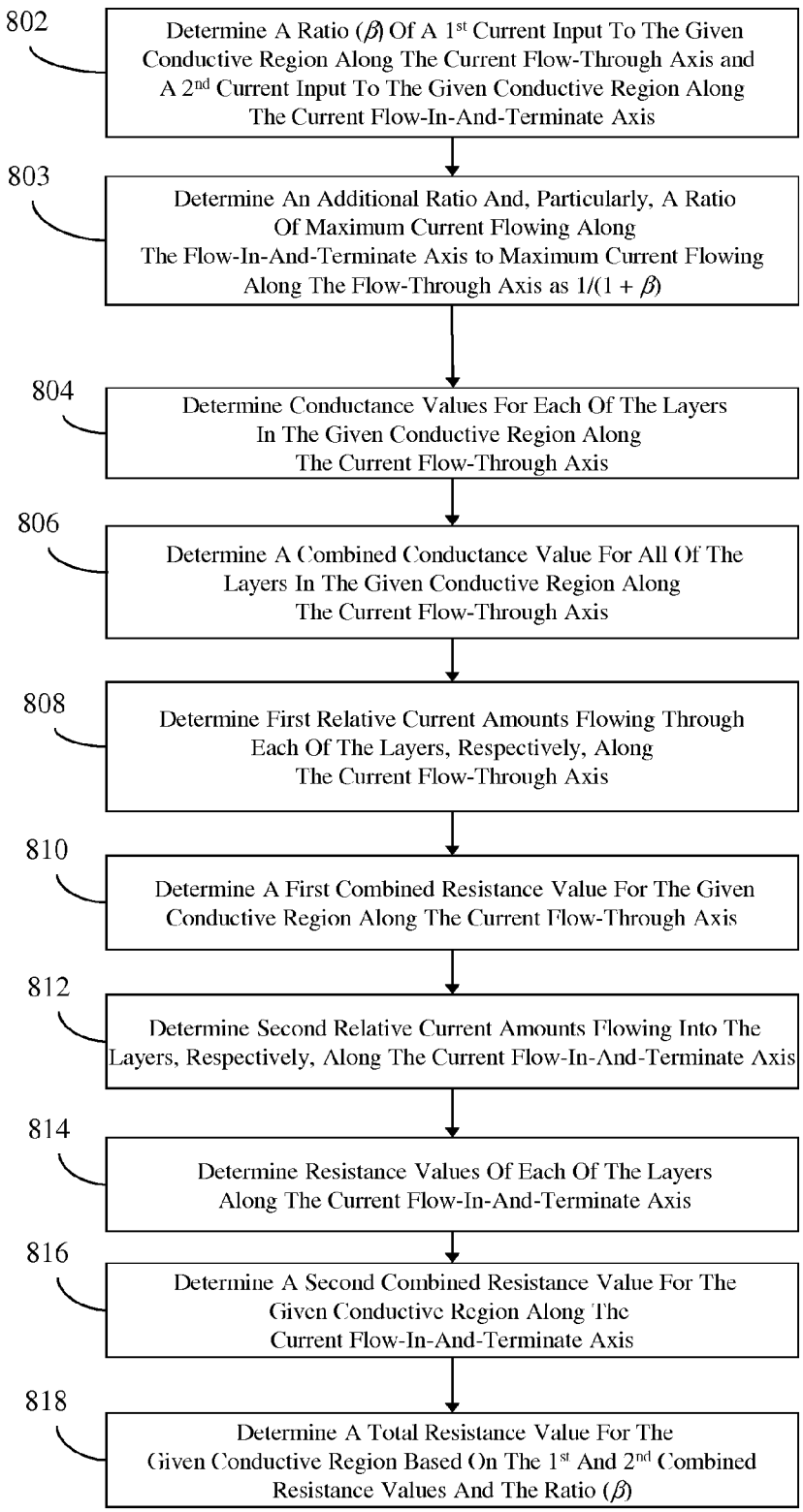
FIG. 8 is a flow diagram further detailing the process 112 of the method of FIG. 1.

Then, the relative electric currents that flow along the current flow-through axis and along the current flow-in-and-terminate axis in each of the layers in that given conductive region (e.g., Layers 1-5 of conductive region $401_1$ in FIGS. 7A-7B) can be evaluated in order to determine a total resistance value for the given conductive region (112). FIG. 8 is a flow diagram further detailing the process 112 of evaluating the electric currents along the current flow-through axis and along the current flow-in-and-terminate axis in each of the layers in a given conductive region in order to determine a total resistance value for that given conductive region. For purposes of illustration, this process 112 will generally be described with respect to the conductive region $401_1$ shown in FIGS. 6 and 7A-7B.

Referring to FIG. 8, this evaluation process 112 can comprise determining, by the processor, a ratio (β) of a first current input to the given conductive region along the current flow-through axis and a second current input to the given conductive region along the current flow-in-and-terminate axis (802). For example, a ratio (β) of a first current input to the conductive region $401_1$ along the current flow-through axis 601 and a second current input to the conductive region $401_1$ along the current flow-in-and-terminate axis 602 can be determined based on the height of the active region of the first semiconductor fin $310_1$ as measured vertically from the bottom of the conductive region $404_1$ (i.e., at the interface between the conductive region $404_1$ and the gate dielectric layer 332) to the top of the first semiconductor fin $310_1$ and on the width of the first semiconductor fin $310_1$. That is, since the conductive region $401_1$ is over the first semiconductor fin $310_1$ in the non-planar FET 300, the only electric current that would be entering the conductive region $401_1$ along the current flow-through axis 601 (i.e., the first current input) will be electric current from the outer sidewall 311 of the first semiconductor fin $310_1$ and the only electric current entering the conductive region $401_1$ along the current flow-in-and-terminate axis 602 (i.e., the second current input) will be from the top surface 312 of the first semiconductor fin $310_1$, the ratio (A can be equal to the height of the active region of the first semiconductor fin $310_1$ over the width of the first semiconductor fin $310_1$ (e.g., $\beta=25$ nm/10 nm=2.5). The method can further comprise determining, by the processor, an additional ratio and, particularly, the ratio of the maximum current flowing along the flow-in-and-terminate axis to the maximum current flowing along the flow-through axis is $1/(1+\beta)$(803).

It should be understood that the ratio ($\beta$) will be different for each of the different conductive regions as a function of the first current input to the conductive region along its current flow-through axis and the second current input to the conductive region along its current flow-in-and-terminate axis. For example, for the conductive region $401_2$ over the second semiconductor fin $310_2$, the ratio ($\beta$) of a first current input to the conductive region $401_2$ along its current flow-through axis over a second current input to the conductive region $401_2$ along its current flow-in-and-terminate axis will be equal to the height of the active regions of the first and second semiconductor fins $310_1$, $310_2$ multiplied by three plus the width of the first semiconductor fin $310_1$ over the width of the second semiconductor fin $310_2$ (e.g., $\beta=(25$ nm$\times 3+10$ nm)/10 nm=85/10=8.5). That is, since the conductive region $401_2$ is over the second semiconductor fin $310_2$ in the non-planar FET 300, it receives a first current input, along its current flow-through axis, of all of the electric current that is output by the first semiconductor fin $310_1$ and any electric current that output by the inner sidewall 314 of the second semiconductor fin $310_2$. It further receives a second current input, along its current flow-in-and-terminate axis, of only that electric current output by the top surface 316 of the second semiconductor fin $310_2$.

In another example, for the conductive region $404_5$, the ratio ($\beta$) would be equal to the height of a lower portion of the active region of the first semiconductor fin $310_1$ as measured vertically from the bottom of the conductive region $404_1$ (i.e., at the interface between the conductive region $404_1$ and the gate dielectric layer 332) to the top of the conductive region $404_4$ (i.e., at the interface between the conductive region $404_4$ and the conductive region $404_4$) over the height of an upper portion of the active region of the first semiconductor fin $310_1$ as measured vertically from the top of the conductive region $404_4$ (i.e., at the interface between the conductive region $404_4$ and the conductive region $404_5$) to the top of the first semiconductor fin $310_1$. This is because the conductive region $404_5$ is positioned laterally adjacent to only the upper portion of the outer sidewall 311 of the first semiconductor fin $310_1$ and because it is above the conductive regions $404_{1-4}$ such that the only electric current that would be entering the conductive region $404_4$ along the current flow-through axis 603 (i.e., the first current input) will be electric current from lower portion of the outer sidewall 311 of the first semiconductor fin $310_1$ and the only electric current that would be entering the conductive region $404_5$ along the current flow-in-and-terminate axis 604 (i.e., the second current input) will be from the upper portion of the outer sidewall 311.

It should further be understood that some conductive regions will have a ratio ($\beta$) that is equal to zero. For example, the conductive region $403_1$ will have a ratio ($\beta$) that is equal to zero because this region is immediately adjacent to the gate dielectric layer 332 above the insulator layer 302 between the first and second semiconductor fins $310_1$ and $310_2$ and, therefore, it receives no first current input along the current flow-through axis 606 (i.e., the first current input is zero). Similarly, the single conductive region of the gate structure 230 of the non-planar FET 200 of FIG. 5 would also have a ratio ($\beta$) that is equal to zero because it receives no first current input along its current flow-through axis 501 (i.e., the first current input is zero).

Referring again to the flow diagram of FIG. 8, this evaluation process 112 can further comprise determining, by the processor, conductance values $Y_1, Y_2, \ldots, Y_M$ for each of the M layers in the given conductive region along the current flow-through axis (804). The conductance values ($Y_1$, $Y_2, \ldots, Y_M$) can be determined based on corresponding dimensions and corresponding resistivity values of the sections(s) of conductive materials within each of the layers of the given conductive region. That is, the conductance value (Y) of a given layer of a given conductive region can be determined based on the corresponding dimension(s) and corresponding resistivity value(s) of the N sections(s) of conductive materials within that given layer. More specifically, the conductance value ($Y_m$) of a given layer (the mth layer) of a given conductive region can be determined using the following summation equation:

$$Y_m = \sum_{n=1}^{N_m} \frac{A_{mn}}{\rho_{mn} L_y}, m = 1, 2, \cdots, M, \quad (1)$$

where $A_{mn}$ is the area of a given section in the given layer and is equal to the height of the given layer ($h_m$) multiplied by the width of the given section ($w_{m,n}$), where $\rho_{mn}$ is the resistivity of the conductive material of the given section in the given layer, and where $L_y$ is the length of the given layer along the current flow-through axis. That is, for each section of a given layer, the area over the resistivity and the length is determined and the sum of the results for all sections of that given layer equals the conductance value for the given layer. Then, a combined conductance value for all the layers in the conductive region along the current flow-through axis ($Y_{through}$) can be determined, by the processor, and this combined conductance value ($Y_{through}$) can be equal to the sum of the conductance values for each layer (806). That is, the combined conductance value ($Y_{through}$) can be determined using the following equation:

$$Y_{through} = \sum_{m=1}^{M} Y_m. \quad (2)$$

Once the combined conductance value for all the layers in the given conductive region along the current flow-through axis ($Y_{through}$) is determined at process 806, first relative current amounts ($j_1, j_2, \ldots, j_M$) flowing through each of the M layers, respectively, along the flow-through axis can be determined by the processor (808). The first relative current amount ($j_m$) for a given layer can be equal to the conductance value for that given layer ($Y_m$) over the combined conductance value ($Y_{through}$). That is, the first relative current value ($j_m$) can be determined using the following equation:

$$j_m = \frac{Y_m}{Y_{through}}, m = 1, 2, \ldots, M. \quad (3)$$

Additionally, the method can comprise determining, by the processor, a first combined resistance value ($R_{through}$) for the given conductive region along the current flow-through axis (810). This first combined resistance value ($R_{through}$) can be based on the combined conductance value ($Y_{through}$) determined at process 806 and the ratio ($\beta$) of the first current input to the given conductive region along the current flow-through axis and a second current input to the given conductive region along the current flow-in-and-terminate axis determined at process 802. Specifically, the first combined resistance value ($R_{through}$) can be determined by solving the following equation:

$$R_{through} = \frac{1}{3Y_{through}}\left(\frac{\beta^2}{(1+\beta)^2} + \frac{\beta}{1+\beta} + 1\right). \quad (4)$$

Figure 9:
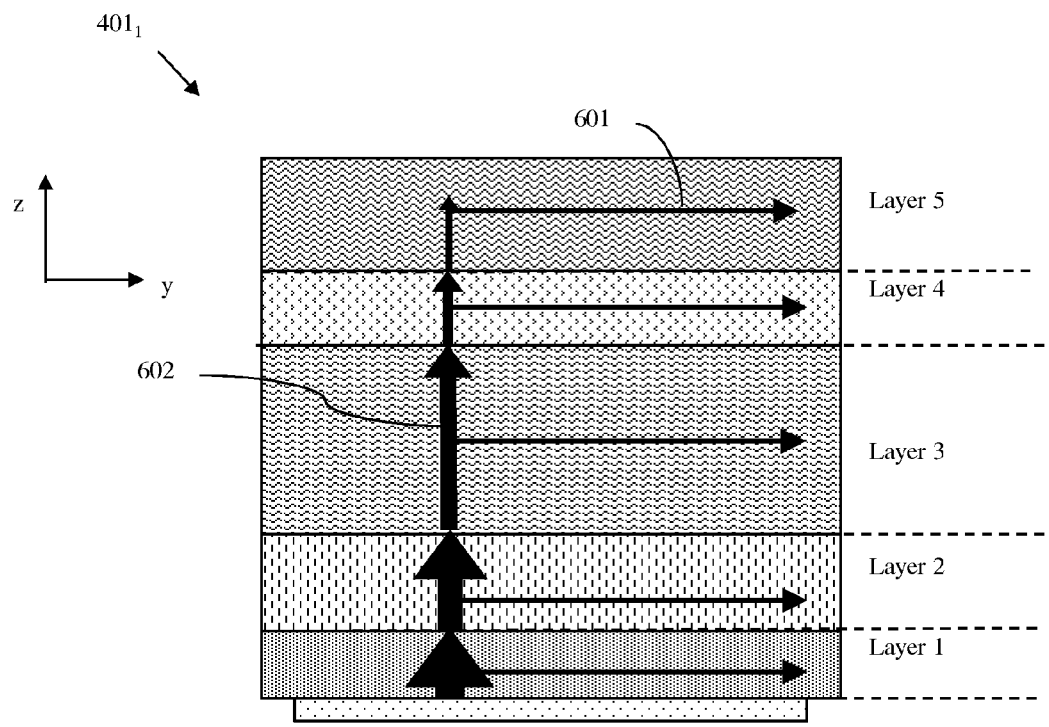
FIG. 9 is a cross-section view of the conductive region $401_1$ of the gate structure of the non-planar FET of FIG. 3B and further illustrating the decrease in current flow from layer to layer along the current flow-in-and-terminate axis in sequence.
Figure 10:
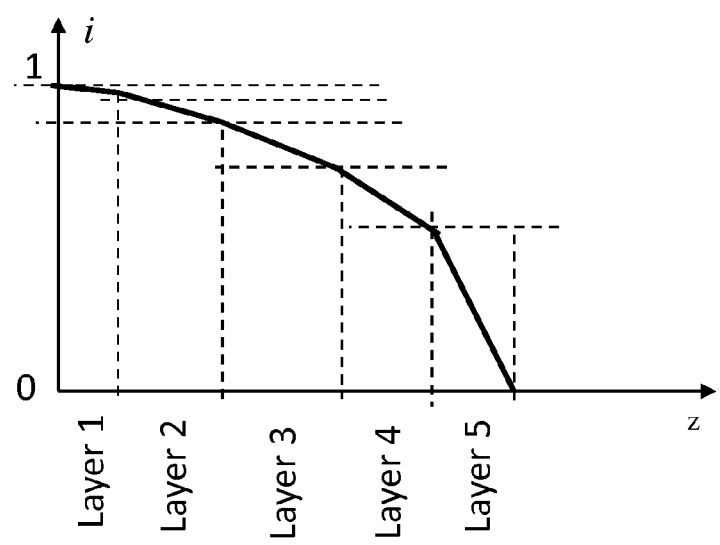
FIG. 10 is a graph further detailing the decrease in current flow from layer to layer along the current flow-in-and-terminate axis in sequence.

The method can further comprise determining, by the processor, second relative current amounts ($i_{1,in}, i_{2,in}, \ldots, i_{M,in}$) flowing into the M layers, respectively, along the flow-in-and-terminate axis (812). As illustrated in FIG. 9 and in the graph of FIG. 10 with reference to the conductive region $401_1$, these second relative current amounts ($i_1, i_2, \ldots, i_M$) can decrease piece-wisely in each of the M layers in sequence from an entering layer (e.g., Layer 1) to a terminating layer (Layer M or, more particularly, Layer 5, also referred to herein as a last layer) as current flowing along the current flow-in-and-terminate axis 602 turns and flows along the current flow-through axis 601. These second relative current amounts ($i_1, i_2, \ldots, i_M$) can be determined based on the first relative current amounts ($j_1, j_2, \ldots, j_M$) in each of the layers along the current flow-through axis determined at process 808. Specifically, each second relative current amount associated with each layer can be determined by solving the following equations:

$$i_{m,in} = i_{m-1,out}, m = 2, 3, \ldots, M, \text{ and} \quad (5)$$

$$i_{m,out} = i_{m,in} - j_m = 1 - \sum_{k=1}^{m} j_k, m = 1, 2, \ldots, M, \quad (6)$$

where $i_{m,in}$ is a second relative amount of current entering a given layer along the current flow-in-and-terminate axis, $i_{m,out}$ is the relative amount of current leaving that same given layer and is, thereby equal to the second relative amount of current entering the next in sequence along the current flow-in-and-terminate axis, and where $j_m$ is the first relative amount of current flowing in the mth layer along the current flow-through axis. Thus, for example, referring to the given conductive region $401_1$ as shown in FIG. 9, in this case, the second relative current amount ($i_{1,in}$) for current entering the entering layer (Layer 1, also referred to herein as the first layer), along the current flow-in-and-terminate axis 602 will be equal to 1. The amount of current leaving the entering layer ($i_{1,out}$) and, thereby the second relative current amount ($i_{2,in}$) entering the second layer (Layer 2) along the current flow-in-and-terminate axis 602 will be equal to 1 minus the first relative current amount ($j_1$) determined for the entering layer at process 808. The amount of current leaving the second layer ($i_{2,out}$) and, thereby the second relative current amount ($i_{3,in}$) entering the third layer (Layer 3) along the current flow-in-and-terminate axis 602 will be equal to the second relative current amount entering the second layer ($i_{2,in}$) minus the first relative current amount ($j_2$) determined for the second layer at process 808 and, more particularly, will be equal to 1 minus the sum of $j_1$ and $j_2$; and so on.

The method can further comprise determining, by the processor, resistance values ($r_1, r_2, \ldots, r_M$) of each of the M layers in the given conductive region along the flow-in-and-terminate axis based on the corresponding dimension(s) and the corresponding resistivity value(s) of the section(s) of conductive material in those layers (814). To determine the resistance values ($r_1, r_2, \ldots, r_M$) of each of the M layers in the given conductive region, the resistance values ($r_{mn}$) for each of the $N_1, N_2, \ldots, N_M$ section(s) in a given layer must first be determined using, for example, the following equation:

$$r_{mn} = \frac{\rho_{mn} h_m}{w_{m,n} L_y},$$

$$m=1, n=1, 2, \ldots, N_1, m=2, n=1, 2, \ldots, N_2, m=M, n=1, 2, \ldots, N_M, \quad (7)$$

where $\rho_{mn}$ is the resistivity of the conductive material of the given section of the given layer, where $h_m$ is the height of the given layer, where $w_{m,n}$ is the width of the given section of the given layer, and where $L_y$ is the length of the given layer along the current flow-through axis. Once the resistance values ($r_{mn}$) for each of the n section(s) in a given layer are determined, the resistance value ($r_m$) for that given layer can be determined using following summation equation:

$$\frac{1}{r_m} = \sum_{n=1}^{N_m} \frac{1}{r_{mn}} = \frac{L_y}{h_m} \sum_{n=1}^{N_m} \frac{w_{m,n}}{\rho_{mn}}. \quad (8)$$

These processes can be repeated to determine the resistance values ($r_1, r_2, \ldots, r_M$) for all of the layers in the given conductive region.

Next, the method can comprise determining, by the processor, a second combined resistance value ($R_{in-and-terminate}$) for the given conductive region along the current flow-in-and-terminate axis (816). This second combined resistance value ($R_{in-and-terminate}$) can be determined based on the second relative current amounts determined at process 812 and the resistance values determined at process 814. Specifically, this second combined resistance value ($R_{in-and-terminate}$) can be determined analytically by solving the following summation equation:

$$R_{in-and-terminate} = \frac{1}{3}\sum_{m=1}^{M}(i_{m,in}^2 + i_{i,in}i_{m,out} + i_{m,out}^2)r_m, \quad (9)$$

where $r_m$ is the resistance value of the mth layer, where $i_{m,in}^2$ is the square of the relative amount of current entering a given layer along the current flow-in-and-terminate axis, where $i_{m,out}^2$ is the square of the relative amount of current exiting the given layer and enter the next layer in sequence along the current flow-in-and-terminate axis, and where $i_{m,in}i_{m,out}$ is the product of the relative amount of current entering and the relative amount of current exiting the given layer. Alternatively, this second combined resistance value ($R_{in-and-terminate}$) can be determined through a simulation process for greater accuracy. Specifically, through determination a variable a can be determined, where a is some value approximately equal to 1 and where a is specifically determined as follows:

$$a = \frac{R_{in-and-terminate,simulation}}{\sum_{m=1}^{M} r_m}. \quad (10)$$

Once the value of a is determined through simulation, then the following equation can be used to solve for the second combined resistance value ($R_{in-and-terminate}$):

$$R_{in-and-terminate} = \frac{a}{3}\sum_{m=1}^{M}(i_{m,in}^2 + i_{i,in}i_{m,out} + i_{m,out}^2)r_m. \quad (11)$$

Once the first combined resistance value ($R_{through}$) for the given conductive region along the current flow-through axis is determined at process 810 and the second combined resistance ($R_{in-terminate}$) value for the given conductive region along the current flow-in-and-terminate axis is determined at process 816, the total resistance value ($R_{tot}$) for the given conductive region can be determined (818). Specifically, the total resistance value ($R_{tot}$) can be determined based on the first combined resistance value ($R_{through}$), the second combined resistance value ($R_{in-and-terminate}$) and the ratio ($\beta$) determined at process 802 or, more particularly, the additional ratio (i.e., the ratio of the maximum current flowing along the flow-in-and-terminate axis to the maximum current flowing along the flow-through axis or $1/(1+\beta)$) determined at process 803. For example, the total resistance value ($R_{tot}$) for the given conductive region can be equal to a weighted sum of the first combined resistance value ($R_{through}$) and the second combined resistance value ($R_{in-and-terminate}$). In this case, the weight for the first combined resistance value ($R_{through}$) can be one and the weight for the second combined resistance value ($R_{in-and-terminate}$) can be the square of the ratio $1/(1+\beta)$ determined at process 803 (i.e., the ratio of input current along the flow-in-and-terminate axis to the output current along the flow-through axis. That is, the total resistance value ($R_{tot}$) can be determined using the following equation:

$$R_{tot} = R_{through} + \frac{1}{(1+\beta)^2}R_{in-and-terminate}, \quad (12)$$

where the multiplier/weight $1/(1+\beta)^2$ for $R_{in-and-terminate}$ comes from the fact that $1/(1+\beta)$ is the ratio of maximum electric current flowing along the flow-in-and-terminate axis to maximum electric current flowing along the flow-through axis.

Referring again to the flow diagram of FIG. 1, it should be noted that, in the case of a complex conductive component, the processes 108-112 can be repeated for each of the multiple conductive regions (114). That is, for each given conductive region, the current flow-through axis and the current flow-in-and-terminate axis for the given conductive region can be determined, the given conductive region can be divided into layers for resistance evaluation purposes and, then, the electric currents in the layers can be evaluated to obtain a corresponding total resistance value for the given conductive region. Then, an overall resistance value for the complex conductive component can be determined based on the following: (1) the corresponding total resistance values for all of the multiple conductive regions; and (2) as calculated for each of the multiple conductive regions, the ratio of maximum electric current flowing in/out of the conductive region to the total electric current flowing out of the complex conductive component (116). One exemplary technique for determining a total resistance value of a gate structure of a non-planar FET using resistance values for each of multiple conductive regions of the gate structure is described in detail in U.S. patent application Ser. No. 13/462,849, filed on May 3, 2012, assigned to International Business Machines Corporation and incorporated herein in its entirety by reference.

Finally, the method can comprise modeling the performance of the semiconductor device based, in part, on the total resistance value ($R_{tot}$) of a simple conductive component as determined at process 112 above (or, if applicable, based, in part, on the overall resistance value of a complex conductive component as determined at process 116 above) (118). Specifically, a netlist (e.g., a Simulation Program with Integrated Circuit Emphasis (SPICE) netlist) can be generated for the semiconductor device (e.g., by a processor executing a netlist generation tool). This netlist can be generated using the total resistance value ($R_{tot}$) of a simple conductive component determined at process 112 (or, if applicable, an overall resistance value of a complex conductive component determined at process 116). Once generated, the netlist can be used (e.g., by a processor executing a simulation tool) to run simulations. The results of the simulations can then be used (e.g., by the processor executing the simulation tool) to model the performance of the semiconductor device itself and, particularly, to predict semiconductor device behavior and reliability.

Figure 11:
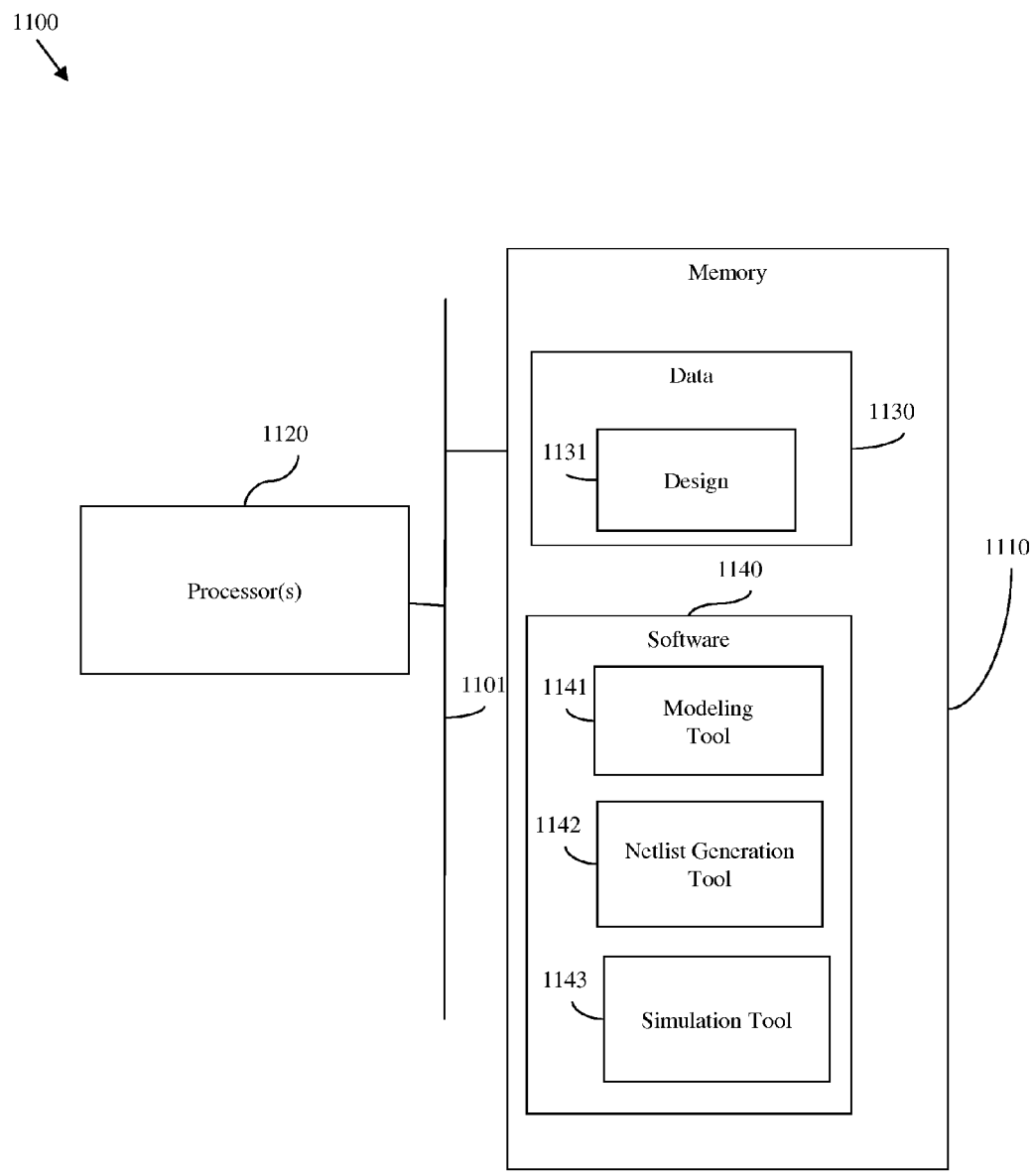
FIG. 11 is a schematic diagram illustrating a resistance modeling system.

Referring to FIG. 11, also disclosed herein is a modeling system 1100. The modeling system 1110 can be implemented, for example, in a computer hardware environment such as that described in detail below and depicted in FIG. 12.

Specifically, the modeling system 1100 can comprise at least one memory 1110 and at least one processor 1120. The at least one memory 1110 can store (i.e., can be adapted to store, can be configured to store, etc.) information including, but not limited to, software 1140 and data 1130. The software 1140 can comprise, for example, a modeling tool 1141, a netlist generation tool 1142, a simulation tool 1143, etc. The data 1130 can comprise at least a design 1131 of a semiconductor device, such as the semiconductor device 200 shown in FIGS. 2A-2B and described in detail above or the semiconductor device 300 shown in FIGS. 3A-3B and described in detail above, can be accessed from a memory by a processor of a computer system in order to model the resistance of a conductive component of the semiconductor device. Specifically, the semiconductor device 200, 300 can comprise a conductive component 230, 330 comprising multiple conductive materials 233-237, 333-337 and, particularly, either a simple conductive component 230 comprising multiple conductive materials 233-237 as in the semiconductor device 200 or a complex conductive component 330 comprising multiple conductive materials 333-337 as in the semiconductor device 300.

As discussed above with regard to the method, for purposes of this disclosure a simple conductive component is a conductive component that receives electric current through a single essentially planar surface (e.g., through a single horizontal or vertical surface), whereas a complex conductive component is a conductive component that receives electric current through multiple different planar surfaces (e.g., through multiple horizontal and/or vertical surfaces). Furthermore, for purposes of illustration, the conductive components 230, 330 of the semiconductor devices 200, 300 are shown and described in detail below as gate structures. However, it should be understood that the method described herein could alternatively be applied in order to model the resistance of other types of simple or complex conductive structures comprising multiple conductive materials (e.g., simple or complex local interconnect structures used in the source/drain regions of FETs).

The processor(s) 1120 can access (i.e., can be adapted to access, can be configured to access, etc.) the design 1131 of a semiconductor device 200, 300 that is stored in the memory 1110 (e.g., over a system bus 1101, as shown, or over any wired or wireless communication network (not shown)) and the software 1140 and can execute the software 1140 in order to model the resistance of a conductive component 230, 330 of that conductive component, as specified in the design 1131 and, based on the resistance, further model the performance of the semiconductor device 200, 300.

Specifically, a processor 1120 can access the design 1131 of the semiconductor device 200, 300 and can analyze (i.e., can be adapted to analyze, can be configured to analyze, can execute the modeling tool 1141 in order to analyze, etc.) the design 1131 of the semiconductor device 200, 300 in order to model the resistance of the conductive component 230, 330. To accomplish this, the processor 1120 can first determine (i.e., can be adapted to first determine, can be configured to first determine, can execute instructions provided by the modeling tool 1141 to first determine, etc.) whether or not the conductive component 230, 330 is a simple conductive component or a complex conductive component. If the conductive component comprises a simple conductive component as with the gate structure 230 of the planar FET 200 of FIGS. 2A-2B, it can be treated as a single conductive region for subsequent resistance evaluation purposes. Alternatively, if the conductive component comprises a complex conductive component as with the gate structure 330 of the non-planar FET 300 of FIGS. 3A-3B, the processor 120 can divide (e.g., can be adapted to divide, can be configured to divide, can execute instructions provided by the modeling tool 1141 to divide, etc.), this complex conductive component into multiple conductive regions for resistance evaluation purposes. Specifically, the gate structure 330 is divided such that within each conductive region, when moving along a "flow-through" axis, the cross-section/composition of the conductive region is essentially unchanged.

Thus, as illustrated in FIG. 4, the gate structure 330 can be divided such that it comprises the following conductive regions: two first conductive regions $401_{1-2}$, which are aligned directly over the first and second semiconductor fin $310_{1-2}$, respectively (i.e., essentially over-fin conductive regions); nine second conductive regions $402_{1-9}$, which are positioned laterally between the first conductive regions $401_1$ and $401_2$ above the level of the top surface of the semiconductor fins $310_{1-2}$ and aligned above the space between those semiconductor fins $310_{1-2}$ (i.e., between-fin and above-fin-top conductive regions); ten third conductive regions $403_{1-10}$, which are between the first and second semiconductor fin $310_{1-2}$ (i.e., between-fin and below-fin-top conductive regions); five fourth conductive regions $404_{1-5}$, which are adjacent to the outer side of the first semiconductor fin $310_1$; five fifth conductive regions $405_{1-5}$, which are above the fourth conductive regions and positioned laterally adjacent to the first conductive region $401_1$ opposite the second region $402_1$; five sixth conductive regions $406_{1-5}$, which are adjacent to the outer side of the second semiconductor fin $310_2$; and five seventh conductive regions $407_{1-5}$, which are above the sixth conductive regions and positioned laterally adjacent to the first conductive region $401_2$ opposite the second conductive region $402_{1-9}$.

It should be noted that these conductive regions do not include the gate dielectric materials because gate dielectric materials conduct only alternating current and not direct current.

Next, the processor 1120 can determine (i.e., can be adapted to determine, can be configured to determine, can execute instructions provided by the modeling tool 1141 in order to determine, etc.) a current flow-through axis as well as a current flow-in-and-terminate axis associated with a given conductive region. As discussed above with regard to the method, for purposes of this disclosure, a current flow-through axis refers to the axis along which electric current flowing through the conductive region exits the conductive region, whereas the current flow-in-and-terminate axis refers to the axis along which electric current enters the conductive region but does not exit (i.e., the electric current changes direction prior to exiting the conductive region). The current flow-through axis will typically be perpendicular to the current flow-in-and-terminate axis. Thus, for example, for the single conductive region of the gate structure 230 of the planar FET 200, a current flow-through axis 501 as well as a current flow-in-and-terminate axis 502 can be determined, as shown in FIG. 5. In this case, the current flow-in-and-terminate axis 502 corresponds to the z-axis because electric current enters the single conductive region vertically and the current flow-through axis 501 corresponds to the y-axis because the electric current turns to the right (i.e., towards the contact 240). Similarly, for a selected over-fin conductive region $401_1$ of the gate structure 330 of the non-planar FET 300, a current flow-through axis 601 as well as a current flow-in-and-terminate axis 602 can be determined, as shown in FIG. 6. In this case, the current flow-in-and-terminate axis 602 corresponds to the z-axis because electric current enters the over-fin conductive region $401_1$ vertically and the current flow-through axis 601 corresponds to the y-axis because the electric current turns to the right (i.e., towards the contact 640).

It should be noted that the orientation of these different axes will vary depending upon the direction through which electric current enters and exits the particular conductive region. For example, for a different selected conductive region (e.g., conductive region $404_5$ of the gate structure 330 of the non-planar FET 300), a current flow-through axis 603 as well as a current flow-in-and-terminate axis 604 can be determined, also as shown in FIG. 6. In this case, the current flow-in-and-terminate axis 604 corresponds to the y-axis because electric current enters the conductive region $404_5$ horizontally and the current flow-through axis 603 corresponds to the z-axis because the electric current turns to the right (i.e., towards the contact 640). For another different selected conductive region (e.g., conductive region $403_1$ of the gate structure 330 of the non-planar FET 300), a current flow-through axis 605 as well as a current flow-in-and-terminate axis 606 can be determined, also as shown in FIG. 6. In this case, the current flow-in-and-terminate axis 606 corresponds to the y-axis because electric current enters the conductive region 403₁ horizontally and the current flow-through axis 605 corresponds to the z-axis because the electric current turns to the left (i.e., towards the contact 640).

Additionally, the processor 1120 can divide (i.e., can be adapted to divide, can be configured to divide, can execute instructions provided by the modeling tool 1141 to divide, etc.) the given conductive region into multiple layers (e.g., M total layers) along the flow-in-and terminate axis for resistance evaluation purposes. This division is performed such that along the flow-in-and-terminate axis, the cross-section/composition of each layer remains essentially unchanged. The mth layer may contain one or more sections (e.g., $N_m$ total sections) of any of one or more of the different gate conductor materials 333-337. Thus, the number $N_m$ of sections in each layer may vary with m. As a result of the techniques used to divide a complex conductive component into multiple conductive regions (if applicable) and the given conductive region into M layers, all sections will have the same length. Furthermore, within any given layer, each section will have the same height; however, the widths of the sections and, thereby the areas of the section may vary.

For example, FIGS. 7A and 7B are illustrations of different cross-section views of the conductive region 401₁ of the gate structure 330 of the non-planar FET 300 divided into 5 layers (see Layers 1-5). As shown in FIG. 7B in the conductive region 401₁, Layer 1 contains a single section 1.1 of the first gate conductor 333; Layer 2 contains two sections 2.1 and 2.3 of the first gate conductor 333 and a section 2.2 of the second gate conductor 334; Layer 3 contains two sections 3.1 and 3.5 of the first gate conductor 333, two sections 3.2 and 3.4 of the second gate conductor 334 and a section 3.3 of the third gate conductor 335; Layer 4 contains two sections 4.1 and 4.7 of the first gate conductor 333, two sections 4.2 and 4.6 of the second gate conductor 334, two sections 4.3 and 4.5 of the third gate conductor 335 and a single section 4.4 of the fourth gate conductor 336; and, Layer 5 contains two sections 5.1 and 5.9 of the first gate conductor 333, two sections 5.2 and 5.8 of the second gate conductor 334, two sections 5.3 and 5.7 of the third gate conductor 335, two sections 5.4 and 5.6 of the fourth gate conductor 336 and a single section 5.5 of the fifth gate conductor 337. As a result of the techniques used to divide a complex conductive component into multiple conductive regions at process 106 (if applicable) and also to divide the conductive region 401₁ into the Layers 1-5 at process 110, all sections will have the same length ($L_y$) along the current flow-through axis. Furthermore, within any given layer, each section will have the same height ($h_{1-5}$, respectively) along the current flow-in-and-terminate axis; however, the widths and, thereby the areas of the sections may vary. For example, within Layer 1, section 1.1 has a width of $w_{1.1}$, a height of $h_1$ and a length of $L_y$; within Layer 2, section 2.1 has a width of $w_{2.1}$, a height of $h_2$ and a length of $L_y$, section 2.2 has a width of $w_{2.2}$, a height of $h_2$ and a length of $L_y$, and section 2.3 has a width of $w_{2.3}$, a height of $h_2$ and a length of $L_y$; and so on.

Then, the processor 1120 can evaluate (i.e., can be adapted to evaluate, can be configured to evaluate, can execute instructions provided by the modeling tool 1141, etc.) the relative electric currents that flow along the current flow-through axis and along the current flow-in-and-terminate axis in each of the M layers in that given conductive region (e.g., Layers 1-5 of the given conductive region 401₁ in FIGS. 7A-7B) in order to determine a total resistance value for the given conductive region. Specifically, in order to evaluate the relative electric currents and determine the total resistance value for the given conductive region, the processor 1120 can perform the following processes (i.e., can be adapted to perform the following processes, can be configured to perform the following processes, can execute instructions provided by the modeling tool 1141 to perform the following processes, etc.). For purposes of illustration, evaluation of the electric currents will generally be described with respect to the conductive region 401₁ shown in FIGS. 6 and 7A-7B.

In order to evaluate the electric currents to obtain the total resistance value of the given conductive region, the processor 1120 can determine a ratio ($\beta$) of a first current input to the given conductive region along the current flow-through axis and a second current input to the given conductive region along the current flow-in-and-terminate axis. For example, a ratio ($\beta$) of a first current input to the conductive region 401₁ along the current flow-through axis 601 and a second current input to the conductive region 401₁ along the current flow-in-and-terminate axis 602 can be determined by the processor 1120 based on the height of the active region of the first semiconductor fin 310₁ as measured vertically from the bottom of the conductive region 404₁ (i.e., at the interface between the conductive region 404₁ and the gate dielectric layer 332) to the top of the first semiconductor fin 310₁ and on the width of the first semiconductor fin 310₁. That is, since the conductive region 401₁ is over the first semiconductor fin 310₁ in the non-planar FET 300, the only electric current that would be entering the conductive region 401₁ along the current flow-through axis 601 (i.e., the first current input) will be electric current from the outer sidewall 311 of the first semiconductor fin 310₁ and the only electric current entering the conductive region 401₁ along the current flow-in-and-terminate axis 602 (i.e., the second current input) will be from the top surface 312 of the first semiconductor fin 310₁, the ratio ($\beta$) can be equal to the height of the active region of the first semiconductor fin 310₁ over the width of the first semiconductor fin 310₁ (e.g., $\beta$=25 nm/10 nm=2.5). As discussed in detail above with regard to the method, it should be understood that the ratio ($\beta$) will be different for each of the different conductive regions as a function of the first current input to the conductive region along its current flow-through axis and the second current input to the conductive region along its current flow-in-and-terminate axis and some conductive regions will have a ratio ($\beta$) that is equal to zero. The processor 1120 can further determine an additional ratio and, particularly, the ratio of the maximum current flowing along the flow-in-and-terminate axis to the maximum current flowing along the flow-through axis is $1/(1+\beta)$.

In order to evaluate the electric currents to obtain the total resistance value of the given conductive region, the processor 1120 can further determine conductance values $Y_1, Y_2, \ldots, Y_M$ for each of the M layers in the given conductive region along the current flow-through axis. The conductance values ($Y_1, Y_2, \ldots, Y_M$) can be determined by the processor based on corresponding dimensions and corresponding resistivity values of the sections(s) of conductive materials within each of the layers of the given conductive region. That is, the conductance value (Y) of a given layer of a given conductive region can be determined based on the corresponding dimension(s) and corresponding resistivity value(s) of the N sections(s) of conductive materials within that given layer. More specifically, the conductance value ($Y_m$) of a given layer of a given conductive region can be determined using the summation equation (1) above. That is, for each section of a given layer, the area over the resistivity and the length is determined and the sum of the results for all sections of that given layer equals the conductance value for the given layer. Then, the processor 1120 can determine a combined conductance value for all the layers in the conductive region along the current flow-through axis ($Y_{through}$). This combined conductance value ($Y_{through}$)

can be equal to the sum of the conductance values for each layer as determined using the equation (2) above.

Once the combined conductance value for all the M layers in the given conductive region along the current flow-through axis ($Y_{through}$) is determined, the processor 1120 can determine first relative current amounts ($j_1, y_2, \ldots, y_M$) flowing through each of the M layers, respectively, along the flow-through axis. The first relative current amount ($j_m$) for a given layer can be equal to the previously determined conductance value for that given layer ($Y_m$) over the previously determined combined conductance value ($Y_{through}$) and, specifically, can be determined by the processor 1120 using the equation (3) above.

In order to evaluate the relative electric currents to obtain the total resistance value of the given conductive region, the processor 1120 can further determine a first combined resistance value ($R_{through}$) for the given conductive region along the current flow-through axis. This first combined resistance value ($R_{through}$) can be based on the previously determined combined conductance value ($Y_{through}$) and the previously determined ratio ($\beta$) of the first current input to the given conductive region along the current flow-through axis and a second current input to the given conductive region along the current flow-in-and-terminate axis. Specifically, the first combined resistance value ($R_{through}$) can be determined by the processor 1120 by solving the equation (4) above.

The processor 1120 can also determine second relative current amounts ($i_1, i_2, \ldots, i_M$) flowing into the M layers, respectively, along the flow-in-and-terminate axis. As illustrated in FIG. 9 and in the graph of FIG. 10 with reference to the conductive region 401₁, these second relative current amounts ($i_1, i_2, \ldots, i_M$) can decrease piece-wise in each of the layers in sequence from the entering layer (e.g., Layer 1, also referred to herein as the first layer) to a terminating layer (Layer M or, more particularly, Layer 5, also referred to herein as the last layer) as current flowing along the current flow-in-and-terminate axis 602 turns and flows along the current flow-through axis 601. These second relative current amounts ($i_1, i_2, \ldots, i_M$) can be determined by the processor 1120 based on the previously determined first relative current amounts ($i_1, i_2, \ldots, j_M$) in each of the layers along the current flow-through axis. Specifically, each second relative current amount associated with each layer can be determined by the processor 1120 by solving equations (5) and (6) above. Thus, for example, referring to the given conductive region 401₁ as shown in FIG. 9, in this case, the second relative current amount ($i_{1,in}$) for current entering the entering layer (Layer 1, also referred to herein as the first layer) along the current flow-in-and-terminate axis 602 will be equal to 1. The amount of current leaving the entering layer ($i_{1,out}$) and, thereby the second relative current amount ($i_{2,in}$) entering the second layer (Layer 2) along the current flow-in-and-terminate axis 602 will be equal to 1 minus the first relative current amount ($j_1$) determined for the entering layer. The amount of current leaving the second layer ($i_{2,out}$) and, thereby the second relative current amount ($i_{3,in}$) entering the third layer (Layer 3) along the current flow-in-and-terminate axis 602 will be equal to the second relative current amount entering the second layer ($i_{2,in}$) minus the first relative current amount ($j_2$) determined for the second layer and, more particularly, will be equal to 1 minus the sum of $j_1$ and $j_2$; and so on.

In order to evaluate the relative electric currents to obtain the total resistance value of the given conductive region, the processor 1120 can further determine resistance values ($r_1, r_2, \ldots, r_M$) of each of the M layers in the given conductive region along the flow-in-and-terminate axis based on the corresponding dimension(s) and the corresponding resistivity value(s) of the section(s) of conductive material in those layers. Specifically, to determine the resistance values ($r_1, r_2, \ldots, r_M$) of each of the M layers in the given conductive region, the processor 1120 can first determine the resistance values ($r_{mn}$) for each of the $N_m$ section(s) in a given layer using, for example, equation (7) above. Once the resistance values ($r_{mn}$) for each of the $N_m$ section(s) (m=1, 2, \ldots, M) in a given layer are determined, the processor 1120 can determine the resistance value ($r_m$) for that given layer using the summation equation (8) above. These processes can be repeated to determine the resistance values ($r_1, r_2, \ldots, r_M$) for all of the layers in the given conductive region.

The processor 1120 can then determine a second combined resistance value ($R_{in-and-terminate}$) for the given conductive region along the current flow-in-and-terminate axis. This second combined resistance value ($R_{in-and-terminate}$) can be determined by the processor 1120 based on the previously determined second relative current amounts and the previously determined resistance values ($r_1, r_2, \ldots, r_M$). Specifically, this second combined resistance value ($R_{in-and-terminate}$) can be determined analytically by solving the summation equation (9) above. Alternatively, this second combined resistance value ($R_{in-and-terminate}$) can be determined through a simulation process for greater accuracy (see detailed discussion of equations (10) and (11) above).

Once both the first combined resistance value ($R_{through}$) for the given conductive region along the current flow-through axis and the second combined resistance ($R_{in-and-terminate}$) value for the given conductive region along the current flow-in-and-terminate axis are determined, the processor 1120 can determine the total resistance value ($R_{tot}$) for the given conductive region. Specifically, the total resistance value ($R_{tot}$) can be determined, by the processor 1120, based on the previously determined first combined resistance value ($R_{through}$), the previously determined second combined resistance value ($R_{in-and-terminate}$) and the previously determine ratio ($\beta$) or, more particularly, the previously determined additional ratio (i.e., the ratio of the maximum current flowing along the flow-in-and-terminate axis to the maximum current flowing along the flow-through axis or $1/(1+\beta)$). For example, the total resistance value ($R_{tot}$) for the given conductive region can be determined using the equation (12) above such that it is equal to a weighted sum of the first combined resistance value ($R_{through}$) and the second combined resistance value ($R_{in-and-terminate}$). In this case, the weight for the first combined resistance value ($R_{through}$) is one and the weight for the second combined resistance value ($R_{in-and-terminate}$) is the square of the ratio $1/(1+\beta)$.

It should be noted that, in the case of a complex conductive component, the processor 1120 can repeat the processes described above for each of the multiple conductive regions to determined corresponding total resistance values for each of the multiple conductive regions. That is, for each given conductive region, the processor 1120 can determine the current flow-through axis and the current flow-in-and-terminate axis for the given conductive region, can divide the given conductive region into layers for resistance evaluation purposes and, can evaluate the layers to obtain a corresponding total resistance value for the given conductive region. The processor 1120 can then determine (i.e., can be adapted to determine, can be configured to determine, can execute instructions provided be the modeling tool 1141 to determine, etc.) an overall resistance value for the complex conductive component based on the following: (1) the corresponding total resistance values for each of the multiple conductive regions and (2) as calculated for each of the multiple conductive regions, the ratio of maximum electric current flowing in/out of the conductive region to the total electric current flowing out of the complex conductive component. As mentioned above with regard to the method, one exemplary technique for determining a total resistance value of a gate structure of a non-planar FET using resistance values for each of multiple conductive regions of the gate structure is described in detail in U.S. patent application Ser. No. 13/462,849, filed on May 3, 2012, assigned to International Business Machines Corporation and incorporated herein in its entirety by reference.

Finally, the processor(s) 1120 can model the performance of the semiconductor device based, in part, on the total resistance value ($R_{tot}$) of a simple conductive component (or, if applicable, based, in part, on the overall resistance value of a complex conductive component). Specifically, the processor(s) 1120 can generate (i.e., can be adapted to generate, can be configured to generate, can execute a netlist generation tool 1142 to generate, etc.) a netlist (e.g., a Simulation Program with Integrated Circuit Emphasis (SPICE) netlist) for the semiconductor device. This netlist can specifically be generated using the total resistance value ($R_{tot}$) of a simple conductive component (or, if applicable, the overall resistance value of a complex conductive component). Once the netlist is generated, processor(s) 1120 can run simulations (i.e., can be adapted to run simulations, can be configured to run simulations, can execute a simulation tool, such as a SPICE simulator, to run simulations, etc.) using the netlist and can further model semiconductor device performance (i.e., can be adapted to model semiconductor performance, can be configured to model semiconductor device performance, can execute the simulation tool to model semiconductor device performance) based on the results of the simulations. That is, the processor(s) 1120 can predict semiconductor device behavior and reliability, based on the results of the simulations.

Also disclosed herein are embodiments of a computer program product. This computer program product can comprise a computer readable storage medium, which stores computer program code. The computer program code can be executable by a computer to perform the above-described resistance modeling method. More specifically, as will be appreciated by one skilled in the art, aspects of the disclosed techniques for modeling resistance can be embodied as a method, system or computer program product. Accordingly, aspects of these techniques may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed techniques may take the form of a computer program product embodied in one or more computer readable medium(s) having computer readable program code embodied thereon.

Any combination of one or more computer readable medium(s) may be utilized. The computer readable medium may be a computer readable storage device or a computer readable signal medium. A computer readable storage medium is a tangible medium and may be, but is not limited to, any of the following: an electronic, magnetic, optical, electromagnetic, infrared, or semiconductor system, apparatus, or device, or any suitable combination of the foregoing. More specific examples (a non-exhaustive list) of the computer readable storage medium would include, but is not limited to, the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electro-magnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed method, system and computer program product are described above with reference to flow-chart illustrations and/or block diagrams. It should be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 12:
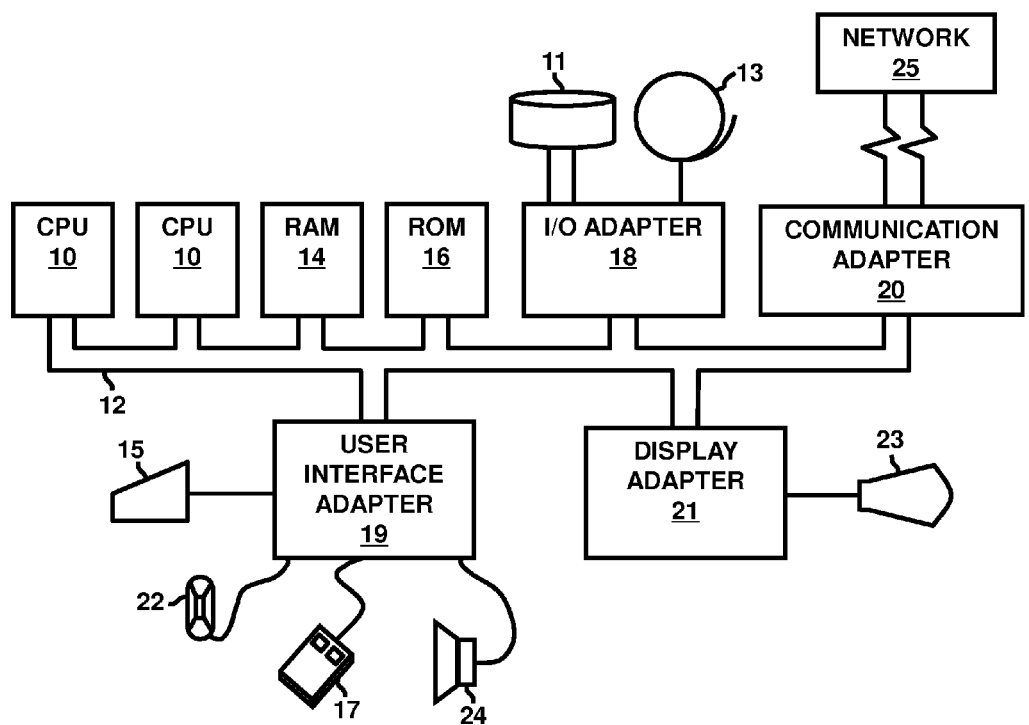
FIG. 12 is a schematic diagram illustrating an exemplary computer hardware environment for implementing the disclosed methods, systems and computer program products.

FIG. 12 is representative hardware environment for implementing the above-disclosed method, system and/or computer program product. This schematic drawing illustrates a hardware configuration of a computerized device, such as an information handling/computer system. The computerized device comprises at least one processor or central processing unit (CPU) 10. The CPUs 10 are interconnected via bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the computerized device. The computerized device can read the inventive instructions on the program storage devices and follow these instructions to execute the methodology of the disclosed embodiments. The computerized device further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be noted that the terminology used herein is for the purpose of describing the system, method and computer program product and is not intended to be limiting. For example, as used herein, the singular forms "a", an and the are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are a method, a system and a computer program product for accurately modeling the resistance of a conductive component of a semiconductor device, where the conductive component comprises multiple conductive materials. Specifically, a design for a semiconductor device can be stored in memory and this semiconductor device can comprise conductive component, such as a simple conductive component or a complex conductive component. The design can be accessed and, if necessary (e.g., in the case of a complex conductive component as opposed to a simple conductive component), the conductive component can be divided into multiple conductive regions for resistance evaluation purposes. Next, for a given conductive component (e.g., for a simple conductive component or, if applicable, for a conductive region of a complex conductive component), the current flow-through axis and the current flow-in-and-terminate axis can be determined. Additionally, the conductive region can be divided into layers for resistance evaluation purposes. Then, the relative electric currents flowing along the current flow-through axis and along the current flow-in-and-terminate axis in each of the layers in the conductive region can be evaluated in order to determine a total resistance value for the conductive region. In the case of a complex conductive component, these processes can be repeated for all of the conductive regions and an overall resistance value can be determined based on the corresponding total resistance values and, as calculated for each conductive region, a ratio of maximum electric current flowing in/out of the conductive region to the total electric current flowing out of the complex conductive component.

What is claimed is:

1. A modeling method comprising:
  accessing, by at least one processor of a computer system from a memory, a design for a semiconductor device comprising a conductive region, said conductive region comprising multiple conductive materials;
  determining, by said processor, a current flow-through axis associated with said conductive region and a current flow-in-and-terminate axis associated with said conductive region;
  dividing, by said processor, said conductive region into layers for evaluation purposes;
  evaluating, by said processor, relative electric currents flowing along said current flow-through axis and along said current flow-in-and-terminate axis in each of said layers in order to determine a total resistance value for said conductive region;
  generating, by said processor, a netlist for said semiconductor device using said total resistance value; and
  simulating, by said processor, performance of said semiconductor device using said netlist.

2. The modeling method of claim 1, said evaluating of said relative electric currents comprising:
  determining, by said processor, a ratio of a first current input to said conductive region along said current flow-through axis and a second current input to said conductive region along said current flow-in-and-terminate axis;
  determining, by said processor, conductance values of each of said layers along said current flow-through axis, said conductance values being based on corresponding dimensions and corresponding resistivity values of any of said multiple conductive materials in said layers;
  determining, by said processor, a combined conductance value of said layers along said current flow-through axis, said combined conductance value being equal to a sum of said conductance values;
  determining, by said processor, first relative current amounts flowing through said layers along said flow-through axis, each first relative current amount being equal to a conductance value for given one of said layers over said combined conductance value;
  determining, by said processor, a first combined resistance value for said conductive region along said current flow-through axis, said first combined resistance value being based on said combined conductance value and said ratio;
  determining, by said processor, second relative current amounts flowing into said layers, respectively, along said flow-in-and-terminate axis, said second relative current amounts being based on said first relative current amounts;

determining, by said processor, resistance values of each of said layers along said flow-in-and-terminate axis based on said corresponding dimensions and said corresponding resistivity values;

determining, by said processor, a second combined resistance value for said conductive region along said current flow-in-and-terminate axis, said second combined resistance value being based on said second relative current amounts and said resistance values; and, determining, by said processor, said total resistance value for said conductive region, said total resistance value being based on said first combined resistance value, said second combined resistance value and said ratio.

3. The modeling method of claim 1, said current flow-through axis being substantially perpendicular to said current flow-in-and-terminate axis.

4. The modeling method of claim 1, said corresponding dimensions comprising length, width, and height.

5. The modeling method of claim 2, said second relative current amounts decreasing in each of said layers in sequence from an entering layer to a terminating layer.

6. The modeling method of claim 2, said second combined resistance value being determined analytically.

7. The modeling method of claim 2, said second combined resistance value being determined through simulation.

8. The modeling method of claim 1, said conductive region comprising a local interconnect structure.

9. The modeling method of claim 1, said semiconductor device comprising a planar field effect transistor and said conductive region comprising a gate structure.

10. The modeling method of claim 1, said semiconductor device comprising a conductive component and said method further comprising:
  before said evaluating, dividing, by said processor, said conductive component into multiple conductive regions for said evaluation purposes;
  repeating, by said processor, said determining, said dividing, and said evaluating for each of said multiple conductive regions to obtain corresponding total resistance values for each of said multiple conductive regions; and,
  determining, by said processor, an overall resistance value for said conductive component based on said corresponding total resistance values.

11. The modeling method of claim 10, said semiconductor device comprising a non-planar field effect transistor comprising at least one semiconductor fin and said conductive component comprising a gate structure adjacent to opposing sidewalls of said semiconductor fin.

12. A modeling system comprising:
  a memory storing a design for a semiconductor device comprising a conductive region, said conductive region comprising multiple conductive materials; and,
  at least one processor accessing said design in said memory and performing the following:
    determining a current flow-through axis associated with said conductive region and a current flow-in-and-terminate axis associated with said conductive region;
    dividing said conductive region into layers for evaluation purposes;
    evaluating relative electric currents flowing along said current flow-through axis and along said current flow-in-and-terminate axis in each of said layers in order to determine a total resistance value for said conductive region;
    generating a netlist for said semiconductor device using said total resistance value; and
    simulating performance of said semiconductor device using said netlist.

13. The modeling system of claim 12, said processor evaluating said relative electric currents by performing the following:
  determining a ratio of a first current input to said conductive region along said current flow-through axis and a second current input to said conductive region along said current flow-in-and-terminate axis;
  determining conductance values of each of said layers along said current flow-through axis, said conductance values being based on corresponding dimensions and corresponding resistivity values of any of said multiple conductive materials in said layers;
  determining a combined conductance value of said layers along said current flow-through axis, said combined conductance value being equal to a sum of said conductance values;
  determining first relative current amounts flowing through said layers along said flow-through axis, each first relative current amount being equal to a conductance value for a given one of said layers over said combined conductance value;
  determining a first combined resistance value for said conductive region along said current flow-through axis, said first combined resistance value being based on said combined conductance value and said ratio;
  determining second relative current amounts flowing into said layers, respectively, along said flow-in-and-terminate axis, said second relative current amounts being based on said first relative current amounts;
  determining resistance values of each of said layers along said flow-in-and-terminate axis based on said corresponding dimensions and said corresponding resistivity values;
  determining a second combined resistance value for said conductive region along said current flow-in-and-terminate axis, said second combined resistance value being based on said second relative current amounts and said resistance values; and,
  determining said total resistance value for said conductive region, said total resistance value being based on said first combined resistance value, said second combined resistance value and said ratio.

14. The modeling system of claim 12, said current flow-through axis being substantially perpendicular to said current flow-in-and-terminate axis.

15. The modeling system of claim 13, said second relative current amounts decreasing in each of said layers in sequence from an entering layer to a terminating layer.

16. The modeling system of claim 12, said conductive region comprising a local interconnect structure.

17. The modeling system of claim 12, said semiconductor device comprising a planar field effect transistor and said conductive region comprising a gate structure.

18. The modeling system of claim 12, said semiconductor device comprising a conductive component and said processor further performing the following:
  dividing said conductive component into multiple conductive regions for said evaluation purposes before said evaluating;
  repeating said determining, said dividing, and said evaluating for each of said multiple conductive regions to obtain corresponding total resistance values for each of said multiple conductive regions; and, determining an overall resistance value for said conductive component based on said corresponding total resistance values.

19. The modeling system of claim 18, said semiconductor device comprising a non-planar field effect transistor comprising at least one semiconductor fin and said conductive component comprising a gate structure adjacent to opposing sidewalls of said semiconductor fin.

20. A computer program product comprising a computer readable storage medium storing computer program code, said computer program code being executable by a computer to perform a modeling method, said method comprising:
- accessing a design for a semiconductor device comprising a conductive region, said conductive region comprising multiple conductive materials;
- determining a current flow-through axis associated with said conductive region and a current flow-in-and-terminate axis associated with said conductive region;
- dividing said conductive region into layers for evaluation purposes;
- evaluating relative electric currents flowing along said current flow-through axis and along said current flow-in-and-terminate axis in each of said layers in order to determine a total resistance value for said conductive region;
- generating a netlist for said semiconductor device using said total resistance value; and
- simulating performance of said semiconductor device using said netlist.

\* \* \* \* \*